(12) United States Patent
Aoki

(10) Patent No.: US 7,613,035 B2
(45) Date of Patent: Nov. 3, 2009

(54) MAGNETIC MEMORY DEVICE AND METHOD OF WRITING INTO THE SAME

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/135,529

(22) Filed: Jun. 9, 2008

(65) Prior Publication Data

US 2008/0239796 A1 Oct. 2, 2008

Related U.S. Application Data

(63) Continuation of application No. PCT/JP2005/022639, filed on Dec. 9, 2005.

(51) Int. Cl.
*G11C 11/00* (2006.01)
(52) U.S. Cl. .................. 365/158; 365/171; 365/173; 365/225.5; 365/243.5
(58) Field of Classification Search .................. 365/158, 365/171, 173, 225.5, 243.5
See application file for complete search history.

(56) References Cited

U.S. PATENT DOCUMENTS

| | | | | |
|---|---|---|---|---|
| 6,791,866 | B2 * | 9/2004 | Ikeda | 365/158 |
| 7,518,897 | B2 * | 4/2009 | Nozieres et al. | 365/50 |
| 7,529,113 | B2 * | 5/2009 | Ueda et al. | 365/63 |
| 2002/0006058 | A1 | 1/2002 | Nakajima et al. | |
| 2003/0117835 | A1 | 6/2003 | Kim et al. | |
| 2005/0047205 | A1 | 3/2005 | Tsuchida | |

FOREIGN PATENT DOCUMENTS

| | | |
|---|---|---|
| JP | 2001-236781 A | 8/2001 |
| JP | 2001-273758 A | 10/2001 |
| JP | 2003-197876 A | 7/2003 |
| JP | 2004-30822 A | 1/2004 |
| JP | 2005-71484 A | 3/2005 |

OTHER PUBLICATIONS

Masaki Aoki et al; "A Novel Voltage Sensing 1T/2MTJ Cell with Resistance Ratio for Highly Stable and Scalable MRAM," 2005 Symposium on VLSI Circuits Digest of Technical Papers; Jun. 18, 2005; pp. 170-171; Cited ISR.

(Continued)

*Primary Examiner*—Pho M. Luu
(74) *Attorney, Agent, or Firm*—Westerman, Hattori, Daniels & Adrian, LLP

(57) ABSTRACT

A magnetic memory device includes a memory cell including magnetoresistance effect elements MTJ1, MTJ2 and a select transistor connected to the connection node of the magnetoresistance effect elements MTJ1, MTJ2, a first signal line extended in a first direction and connected to the magnetoresistance effect element MTJ1, a second signal line extended in the first direction and connected to the magnetoresistance effect element MTJ2, and a third signal line extended in a second direction and crossing the first signal line in a region where the magnetoresistance effect element MTJ1 is formed and crossing the second signal line in a region where the magnetoresistance effect element MTJ2 is formed. When memory information is written into the memory cell, the memory information to be memorized is switched by directions of write currents to be flowed to the first and the second signal lines.

16 Claims, 31 Drawing Sheets

OTHER PUBLICATIONS

Roy Scheuerlein et al; "A 10ns Read and Write Non-Volatile Memory Array Using a Magnetic Tunnel Junction and FET Switch in each Cell," ISSCC Dig. Tech. Papers; 2000 IEEE; pp. 128-129, Feb. 8, 2000.

M. Durlam et al; "A low power 1Mbit MRAM based on 1T1MTJ bit cell integrated with Copper Interconnects," 2002 Symposium on VLSI Circuits Digest of Technical Papers; pp. 158-161, Mar. 2, 2002.

N. Tanabe et al; "A High Density 1T/2C Cell with Vcc/2 Reference Level for High Stable FeRAMs," IEDM Tech. Dig; 1997 IEEE; pp. 863-866, Jul. 1997.

International Search Report of PCT/JP2005/022639, date of mailing Jun. 27, 2006.

* cited by examiner

MAGNETIC MEMORY DEVICE AND METHOD OF WRITING INTO THE SAME

CROSS REFERENCE TO RELATED APPLICATIONS

This application is a Continuation of International Application No. PCT/JP2005/022639, with an international filing date of Dec. 9, 2005, which designating the United States of America, the entire contents of which are incorporated herein by reference.

TECHNICAL FIELD

The present invention relates to a magnetic memory device, more specifically, a magnetic memory device using resistance changes based on orientations of spins of the magnetic layers, and a method of writing into the magnetic memory device.

BACKGROUND

Recently, as a rewritable nonvolatile memory, the magnetic random access memory (hereinafter called MRAM) including magnetoresistance effect elements arranged in a matrix is noted. The MRAM memorizes information by using combinations of magnetization directions of two magnetic layers and read memorized information by detecting resistance changes (i.e., current changes or voltage changes) between when magnetization directions between the magnetic layers are parallel and when magnetization directions between the magnetic layers are antiparallel are detected.

As one of the magnetoresistance effect elements forming the MRAM, the magnetic tunnel junction (MTJ) element is known. The MTJ element includes two ferromagnetic layers stacked with a tunnel insulating film therebetween and uses the phenomenon that the tunnel current flowing between the magnetic layers via the tunnel insulating film changes based on relationships between the magnetization directions of the two ferromagnetic layers. That is, the MTJ element has a low element resistance when the magnetization directions of the two ferromagnetic layers are parallel and a high element resistance when the magnetization directions of the two ferromagnetic layers are antiparallel. These two states are related to data "0" and data "1", whereby the MTJ element can be used as a memory element.

Writing information into the MTJ element is made by applying a magnetic field to the MTJ element to inverse a magnetization direction of one ferromagnetic layer (free magnetization layer). Specifically, currents are flowed respectively in two lines arranged crossing each other, and a synthetic magnetic field formed by these currents is applied to the MTJ element. The direction of the current flowed in one line is made opposite, whereby a direction of the synthetic magnetic field to be applied to the MTJ element is also inversed. Thus, the magnetization direction of the free magnetization layer of the MTJ element can be arbitrarily controlled.

As conventional magnetic memory devices using the MTJ element are proposed 1T-1MTJ magnetic memory device comprising one memory cell including one MOS transistor and one MTJ element, 2T-2MTJ magnetic memory device comprising one memory cell including two MOS transistors and two MTJ elements, and others.

Related arts are disclosed in, e.g., Japanese published unexamined patent application No. 2001-236781, Japanese published unexamined patent application No. 2001-273758; Japanese published unexamined patent application No. 2003-197876; Japanese published unexamined patent application No. 2004-030822; M. Aoki et al., "A novel voltage sensing 1T/2MTJ cell with resistance ratio for high stable and scalable MRAM", 2005 Symposium on VLSI Circuits Digest of Technical Papers, pp. 170-171; Roy Scheuerlein et al., "A 10 ns read and write non-volatile memory array using a magnetic tunnel junction and FET switch in each Cell", ISSCC Dig. Tech. Papers, pp. 128-129, 2000; M. Durlam et al., "A low power 1 Mbit MRAM based on 1T1MTJ bit cell integrated with copper interconnects", Symposium on VLSI Circuits Dig. Tech. Papers, pp. 158-161, 2002; and N. Tanabe et al., "A high density 1T/2C cell with Vcc/2 reference level for high stable FeRAMs", IEDM Tech. Dig., pp. 863-866, 1997.

However, the 2T-2MTJ magnetic memory device includes a large number of the elements forming one memory cell, which makes it difficult to improve the integration. The 1T-1MTJ magnetic memory device, however, is easy to be integrated in comparison with the 2T-2MTJ magnetic memory device. However, reference signals are generated by reference cells, and fluctuation of the reference cells directly influences the read margin. Especially, one reference cell is provided for a plurality of bit lines, some of the bit lines are near the reference cell and others are remote from the reference cell, which largely influences the fluctuation of the characteristics of the MTJ elements. Thus, the reading by the differential amplification using a pair of adjacent bit lines, which is characterized by being strong to noises, cannot be made, and there is a risk that the resistance to noises would be decreased.

SUMMARY

According to one aspect of an embodiment, there is provided a method of writing into a magnetic memory device comprising: flowing a first write current to a first signal line; flowing a second write current to a second signal line, the second write current being directed opposite to the first write current; flowing a third write current to a third signal line; and memorizing a first memory information or a second memory information, based on directions of the first write current and the second write current, wherein the magnetic memory device including a memory cell including a first magnetoresistance effect element, a second magnetoresistance effect element having one terminal connected to one terminal of the first magnetoresistance effect element, and a select transistor connected to a connection node of the first magnetoresistance effect element and the second magnetoresistance effect element; the first signal line extended in a first direction and connected to the other end of the first magnetoresistance effect element; the second signal line extended in the first direction and connected to the other end of the second magnetoresistance effect element; and the third signal line extended in a second direction crossing the first direction, crossing the first signal line in a region where the first magnetoresistance effect element is formed, and crossing the second signal line in the region where the second magnetoresistance effect element is formed, wherein the magnetic memory device memorizes the first memory information with the first magnetoresistance effect element being in a high resistance state and the second magnetoresistance effect element being in a lower resistance state or the second memory information with the first magnetoresistance effect element being in the lower resistance state and the second magnetoresistance effect element being in the high resistance state.

According to another aspect of an embodiment, there is provided a method of writing into a magnetic memory device comprising: when a first memory information is written into a memory cell, a first write current is flowed to a first signal line, a second write current being directed opposite to the first write current is flowed to a second signal line, and a third write current is flowed to a third signal line to apply to a first magnetoresistance effect element a synthetic magnetic field of a magnetic field generated by the first write current and a magnetic field generated by the third write current and apply to a second magnetoresistance effect element a synthetic magnetic field of a magnetic field generated by the second write current and a magnetic field generated by the third write current, and when a second memory information is written in the memory cell, a fourth write current which is directed opposite to the first write current is flowed to the first signal line, a fifth write current of the same direction as the first write current is flowed to the second signal line, a sixth write current of the same direction as the third write current is flowed to the third signal line to apply the first magnetoresistance effect element a synthetic magnetic field of a magnetic field generated by the fourth write current and a magnetic field generated by the sixth write current and apply to the second magnetoresistance effect element a synthetic magnetic field of a magnetic field generated by the fifth write current and a magnetic field generated by the sixth write current, wherein the magnetic memory device including the memory cell including the first magnetoresistance effect element, the second magnetoresistance effect element having one terminal connected to one terminal of the first magnetoresistance effect element, and a select transistor connected to a connection node of the first magnetoresistance effect element and the second magnetoresistance effect element; the first signal line extended in a first direction and connected to the other end of the first magnetoresistance effect element; the second signal line extended in the first direction and connected to the other end of the second magnetoresistance effect element; and the third signal line extended in a second direction crossing the first direction, crossing the first signal line in a region where the first magnetoresistance effect element is formed, and crossing the second signal line in the region where the second magnetoresistance effect element is formed, wherein the magnetic memory device memorizes the first memory information with the first magnetoresistance effect element being in a high resistance state and the second magnetoresistance effect element being in a lower resistance state or the second memory information with the first magnetoresistance effect element being in the lower resistance state and the second magnetoresistance effect element being in the high resistance state.

According to further another aspect of an embodiment, there is provided a magnetic memory device comprising: a memory cell including a first magnetoresistance effect element, a second magnetoresistance effect element having one terminal connected to one terminal of the first magnetoresistance effect element, and a select transistor connected to a connection node of the first magnetoresistance effect element and the second magnetoresistance effect element; a first signal line extended in a first direction and connected to the other end of the first magnetoresistance effect element; a second signal line extended in the first direction and connected to the other end of the second magnetoresistance effect element; a third signal line extended in a second direction crossing the first direction, crossing the first signal line in a region where the first magnetoresistance effect element is formed, and crossing the second signal line in the region where the second magnetoresistance effect element is formed, a fourth signal line extended in the first direction and connected to the connection node of the memory cell via the select transistor; and another memory cell formed adjacent to said memory cell in the first direction, wherein the select transistors of said memory cell and said another memory cell are formed in one active region, and a contact connecting the select transistors of said memory cell and said another memory cells to the fourth signal line are in common.

DETAILED DESCRIPTION OF THE EMBODIMENTS

A First Embodiment

Figure 1:
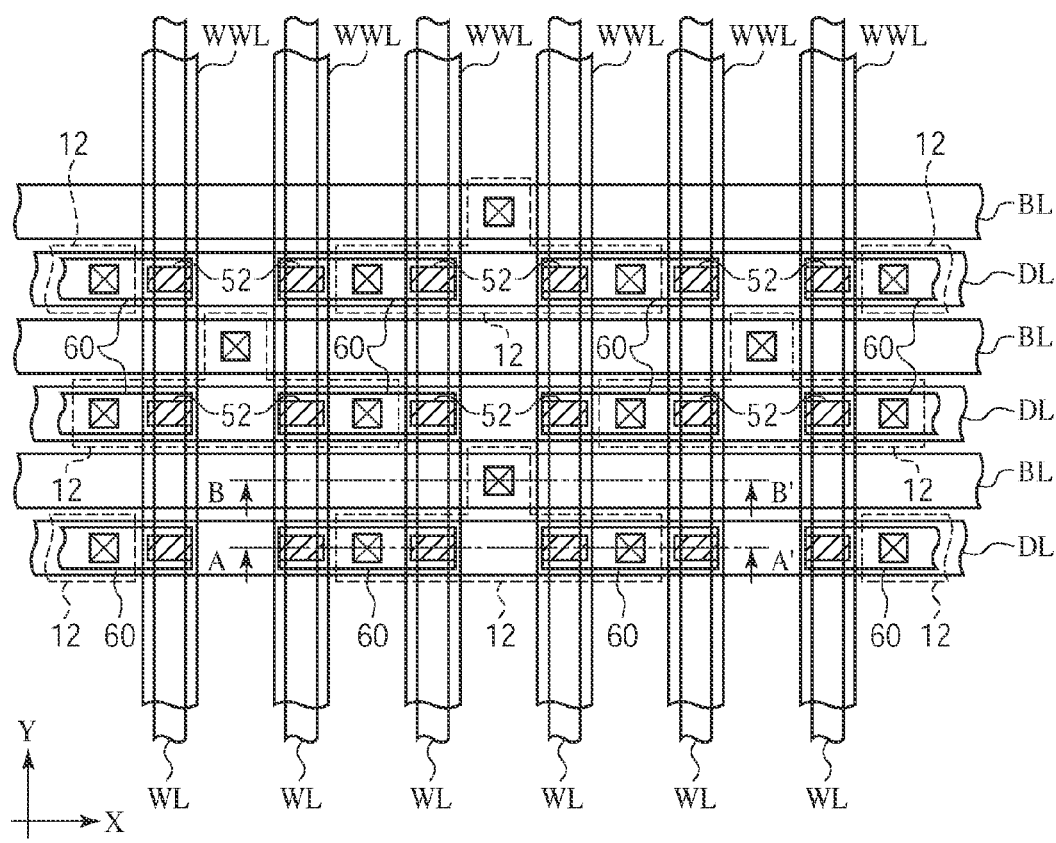
FIG. 1 is a plan view showing the structure of the magnetic memory device according to a first embodiment of the present invention.
Figure 2:
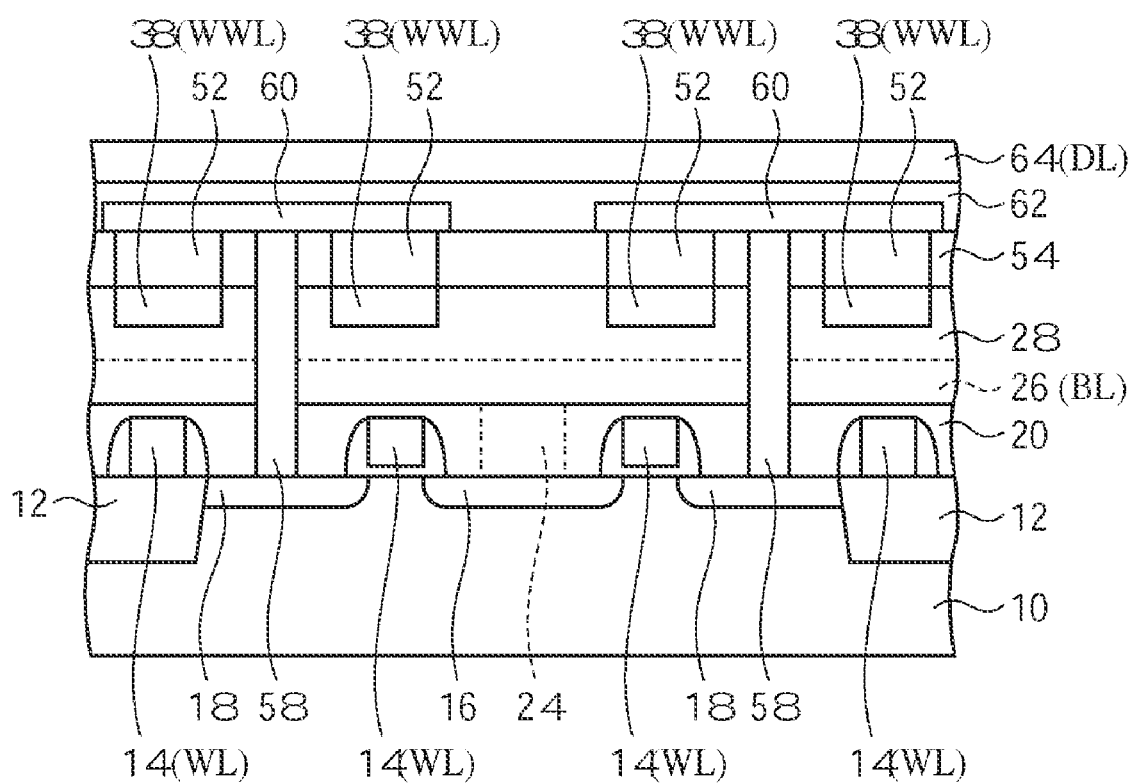
FIG. 2 is a diagrammatic sectional view showing the structure of the magnetic memory device according to the first embodiment of the present invention.

The magnetic memory device and the method of writing into the same according to a first embodiment of the present invention will be explained with reference to FIGS. 1 to 14M.

First, the structure of the magnetic memory device according to the present embodiment will be explained with reference to FIGS. 1 to 4.

In a silicon substrate 10, a device isolation film 12 for defining on the surface thereof a plurality of active regions is formed. The active regions each has a T-shape formed of a rectangular transistor-formed portion elongated in the X-direction and a contact portion which is projected from the center of the transistor-formed region in the Y-direction, and are arranged zigzag to each other.

Over the silicon substrate 10 with the device isolation film 12 formed in, a plurality of word lines WL (the fifth signal lines) extended in the Y-direction are formed. The word lines WL are extended two in each active region. In the active region on both sides of the each word line WL, source/drain regions 16, 18 are formed. Thus, in each active region, two select transistors each including a gate electrode 14 functioning also as the word line WL, and the source/drain regions 16, 18 are formed. The two select transistors formed in each active region have the source/drain region 16 in common.

Over the silicon substrate 10 with the select transistors formed on, an inter-layer insulating film 20 is formed. In the inter-layer insulating film 20, contact plugs 24 connected to the source/drain regions 16 formed in the contact portions of the active regions are buried. Over the inter-layer insulating film 20, a plurality of bit lines 26 (BL) (the fourth signal lines) electrically connected to the source/drain regions 16 via the contact plugs 24 are formed. The bit lines 26 are formed, crossing the contact portions of the active regions thereabove.

Figure 3:
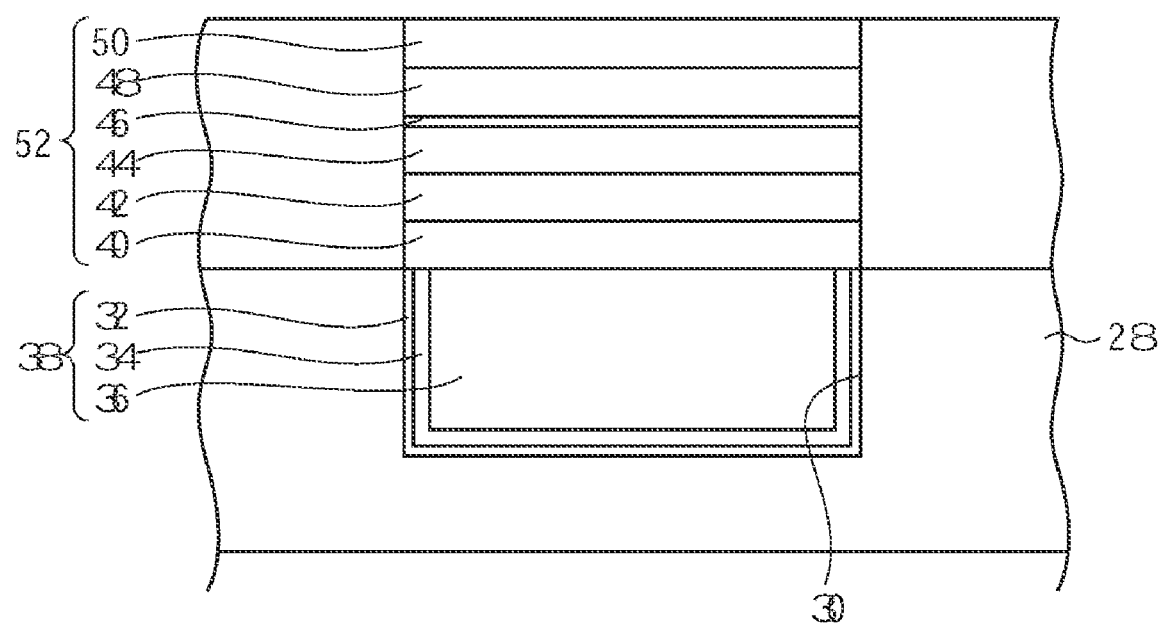
FIG. 3 is a partial enlarged view showing the structure of the magnetic memory device according to the first embodiment of the present invention.

Over the interlayer insulating film 20 with the bit lines 26 formed on, an inter-layer insulating film 28 is formed. In the inter-layer insulating film 28, a plurality of write word lines 38 (WWL) (the first and the second signal lines) extended in the Y-direction are formed. The write word lines 38 are formed respectively above the respective word lines WL. As shown in FIG. 3, the write word lines 38 are formed of a Ta film 32 as a barrier metal formed along the inside wall of interconnection trenches 30, an NiFe film 34 of high magnetic permeability provided for intensifying the magnetic fields and a Cu film 36 which the main interconnection portions.

Over the inter-layer insulating film 28 with the write word lines 38 buried in, MTJ elements 52 are formed. As shown in FIG. 1, the MTJ elements 52 are formed in the respective regions where the write word lines 38 cross the active regions.

The MTJ elements 52 are each formed of the layer film of a lower electrode layer 40 of a nonmagnetic material of, e.g., Ta or others, an antiferromagnetic layer 42 of an antiferromagnetic material of, e.g., PtMn or others, a pinned magnetization layer 44 of a ferromagnetic material of, e.g., CoFe or others, a tunnel insulating film 46 of an insulation material of, e.g., alumina or others, a free magnetization layer 48 of a ferromagnetic material, of, e.g., CoFe or others and a cap layer 50 of a nonmagnetic material of, e.g., Ta or others.

Over the inter-layer insulating film 28 except the regions where the MTJ elements 52 are formed, an inter-layer insulating film 54 is formed. In the inter-layer insulating films 54, 28, 20, contact plugs 58 connected to the source/drain regions 18 are buried. Over the inter-layer insulating film 54, an upper electrode layer 60 which electrically connects the MTJ elements 52 adjacent to each other in the X-direction with the contact plug 58 therebetween, and the contact plug 58.

Over the inter-layer insulating film 54 with the upper electrode layer 60 formed on, an inter-layer insulating film 62 is formed. Over the inter-layer insulating film 62, a plurality of digit lines 64 (DL) (the third signal lines) extended in the X-direction are formed. The digit lines 64 are formed crossing the MTJ elements arranged in the X-direction thereabove. The extending direction of the digit lines 64 (DL) (X-direction) are in parallel with the axis of easy magnetization inversion axis (the major axis) of the MTJ elements.

The magnetic memory device according to the present embodiment is of the 1T-2MTJ type that one memory cell includes one select transistor and two MTJ elements. This will be explained with reference to FIG. 2. To the source/drain region 18 of the select transistor including the gate electrode 14 which is the second from the right side of the drawing, and the source/drain regions 16, 18 formed on the left and the right side of the gate electrode 14, two MTJ elements are connected via the contact plug 58 and the upper electrode layer 60. Such select transistor and the MTJ elements 52 form one memory cell. Similarly, to the source/drain region 18 of the select transistor including the gate electrode 14 which is the second from the left side of the drawing, and the source/drain regions 16, 18 formed on the left and the right sides of the gate electrode 14, two MTJ elements 52 are connected via the contact pugs 58 and the upper electrode layer 60. Such select transistor and the MTJ elements 52 form another memory cell. Thus, in each active region, two memory cells having the bit line contact in common are formed.

Figure 4:
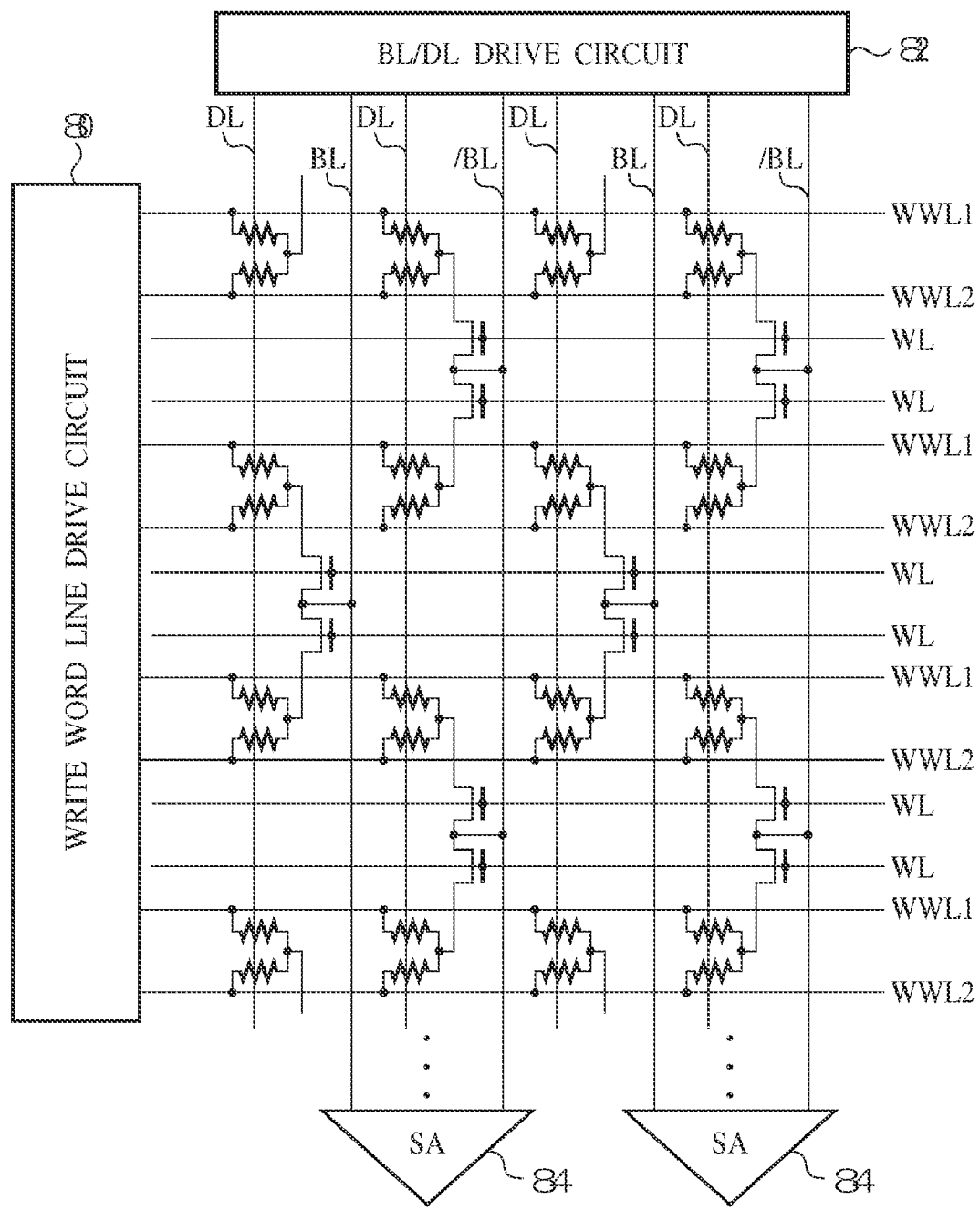
FIG. 4 is a circuit diagram showing the structure of the magnetic memory device according to the first embodiment of the present invention.

FIG. 4 is a circuit diagram of the memory cell array of the magnetic memory device according to the present embodiment. As shown, the write word lines WWL are connected to a write word line drive circuit 80. The write word lines drive circuit 80 includes a write current generating circuit which supplies a write current to the write word lines WWL1, WWL2, and a read voltage generating circuit which applies a read voltage to the write word lines WWL1 upon a read. One ends of the bit lines BL, /BL and the digit lines DL are connected to a BL/DL drive circuit 82. The BL/DL drive circuit 82 includes a write current generating circuit which supplies a write current to the digit lines DL, and a reference voltage generating circuit which applies a reference voltage to the bit lines /BL upon a read. The other ends of the bit lines BL, /BL are connected to sense amplifiers 84. Two adjacent bit lines BL are connected to each sense amplifier 84, forming a folded bit line structure in which the adjacent bit lines BL, /BL are inputted to the sense amplifier.

In the magnetic memory device according to the present embodiment, the bit lines BL for reading and the digit lines DL for writing are arranged in the same direction, but the bit lines BL are formed of the first metal lines, and the digit lines DL are formed of the third metal lines, whereby the bit lines BL and the digit lines DL can be accommodated at a pitch of 2F (F is the minimum feature size). On the other hand, in the direction vertical to the bit lines BL, the pitch is 4F so as to accommodate two write word lines. Thus, the area of unit memory cell of the magnetic memory device according to the present embodiment is $4F \times 2F = 8F^2$ and is equivalent to the area of the 1T-1MTJ memory cell.

Next, the method of writing into the magnetic memory device according to the present embodiment will be explained with reference to FIGS. 5 to 8.

As described above, the magnetic memory device according to the present embodiment includes memory cells of the 1T-2MTJ type. In the two MTJ elements included in one memory cells, information is written complementarily in a state of a high resistance (high resistance state) and a state of a low resistance state (low resistance state). That is, in one of the MTJ elements, a magnetization direction of the pinned magnetization layer 44 is opposite to a magnetization direction of the free magnetization layer 48 (the high resistance state), and in the other of the MTJ elements, the magnetization direction of the pinned magnetization layer 44 is the same as a magnetization direction of the free magnetization layer 48 (the low resistance state).

Figure 5:
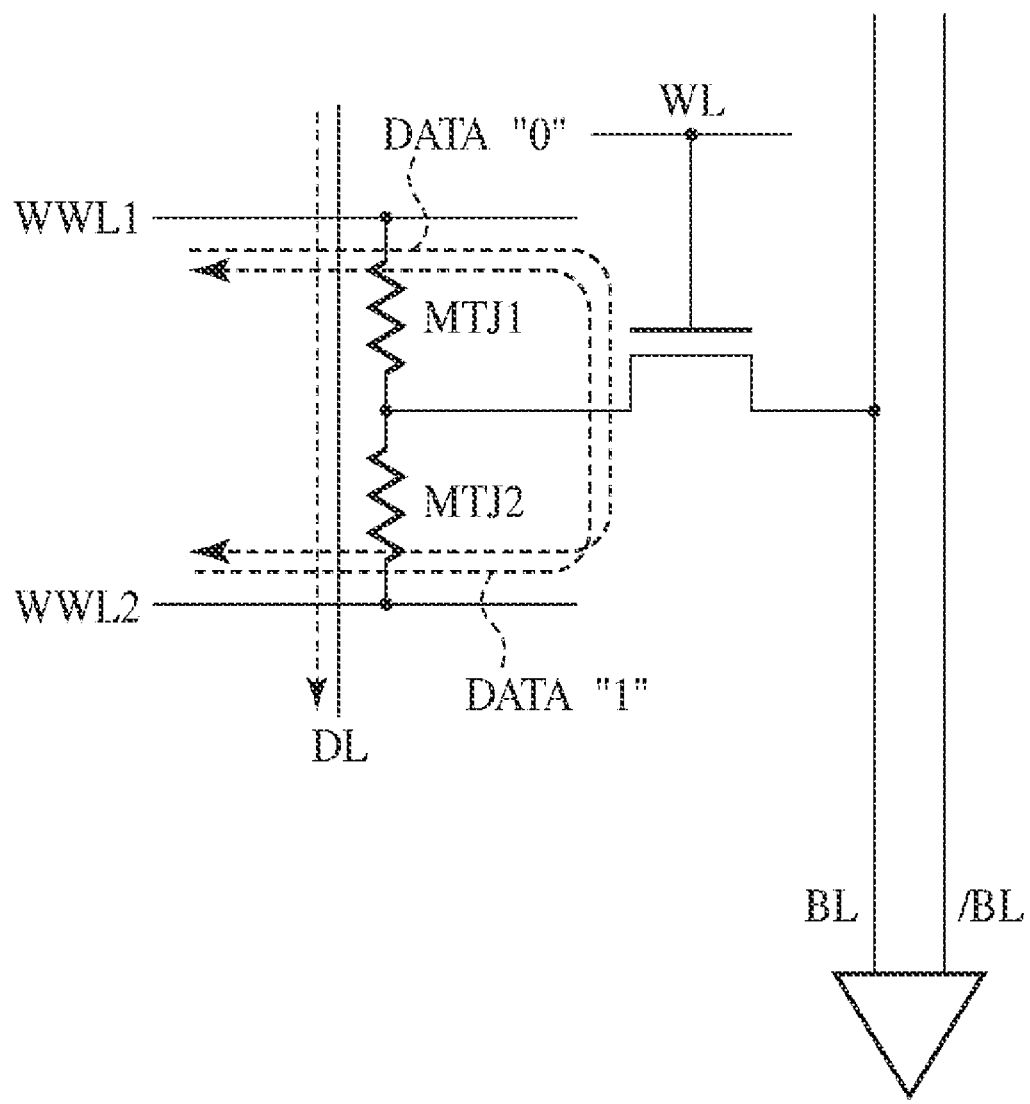
FIG. 5 is a circuit diagram showing the principle of the method of writing into the magnetic memory device according to the first embodiment of the present invention.

Then, as shown in FIG. 5, to the write word line WWL1 connected to one MTJ element (MTJ1) and the write word line WWL2 connected to the other MTJ element (MTJ2), write currents opposite to each other are flowed. The directions of the write currents flowed to the write word lines WWL1, WWL2 are directions corresponding to information to be memorized. For example, when data "0" is memorized, a write current directed right as viewed in the drawing is flowed to the write word line WWL1, and to the write word line WWL2, a write current directed left as viewed in the drawing is flowed. When data "1" is memorized, a write current directed left as viewed in the drawing is flowed to the write word line WWL1, and to the write word line WWL2, a write current directed right as viewed in the drawing is flowed.

To the digit line DL extended over the MTJ elements (MTJ1, MTJ2) to be written, a prescribed write current is flowed. The direction of a write current to be flowed to the digit line DL is constant (e.g., downward in FIG. 5) irrespective of information to be memorized.

The write currents to be flowed to the write word line WWL1, WWL2 and the digit line DL are set so that a magnetic field generated by flowing the write current to one alone of the write word lines WWL1, WWL2 and the digit line DL is smaller than a magnetization inversion intensity of the MTJ elements (MTJ1, MTJ2), but a synthetic magnetic field of magnetic fields generated by the write currents flowed in the write word lines WWL1, WWL2 and a magnetic field generated by the write current flowed to the digit line DL is larger than the magnetization inversion intensity of the MTJ elements (MTJ1, MTJ2).

Thus, the free magnetization layers 48 of the MTJ elements (MTJ1, MTJ2) are magnetized in directions corresponding to the synthetic magnetic fields of magnetic fields generated by the currents flowed to the write word lines WWL1, WWL2 and a magnetic field generated by the current flowed to the digit line DL. The direction of the current flowed to the write word line WWL1 and the direction of the current flowed to the write word line WWL2 are opposite to each other, whereby the magnetization direction of the MTJ elements (MTJ1, MTJ2) are opposite to each other, and the writes can be complementary.

The signal lines which inverse directions of the write currents corresponding to information to be written are preferably the write word lines WWL1, WWL2. Directions of the currents to be flowed to the write word lines WWL1, WWL2 are inversed, whereby directions of the magnetic fields to be applied when the MTJ element (MTJ1) is rewritten to the high resistance state, and the MTJ element (MTJ2) is rewritten to the high resistance state, and directions of the magnetic field to be applied when the MTJ element (MTJ1) is rewritten to the low resistance state, and the MTJ element (MTJ2) is rewritten to the low resistance state can be made respectively equal. Thus, a write can be made in the two MTJ elements (MTJ1, MTJ2) under one and the same condition.

Figure 6:
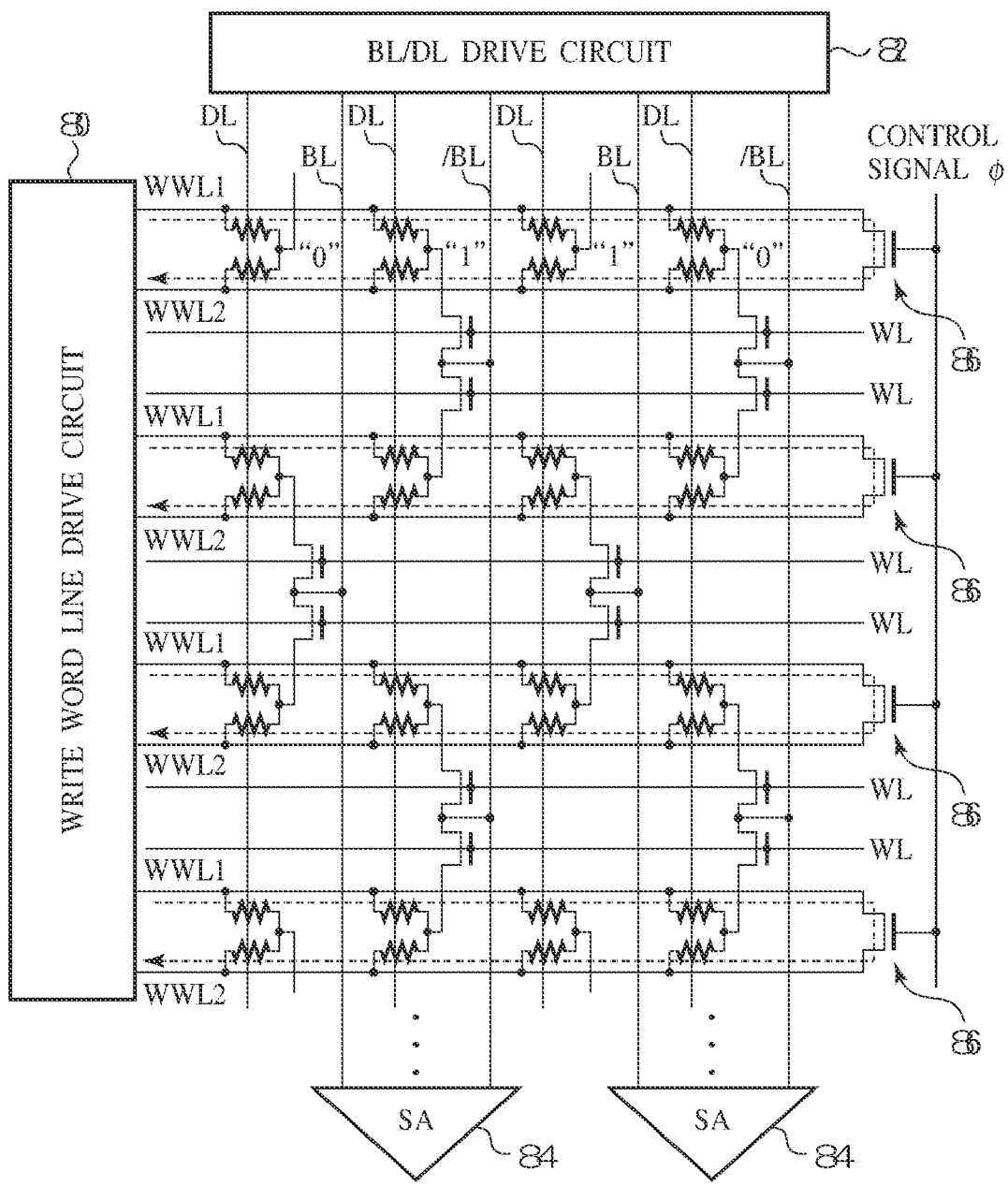
FIGS. 6-8 are circuit diagrams showing the structures in writing into the magnetic memory device according to the first embodiment of the present invention.

In the circuit shown in FIG. 6, at the ends of the write word lines WWL1, WWL2, which are opposite to the write word line drive circuit 90, a switching element 86 for connecting and disconnecting the write word lines WWL1 and the write word line WWL2 is provided.

The switching element 86 is provided between the write word lines WWL1, WWL2, whereby only by turning on the switching element 86 by a control signal Φ, the write currents supplied from the write word line drive circuit 80 can be oppositely flowed to the write word line WWL1 and the write word line WWL2. This can make the writing operation simple.

Figure 7:
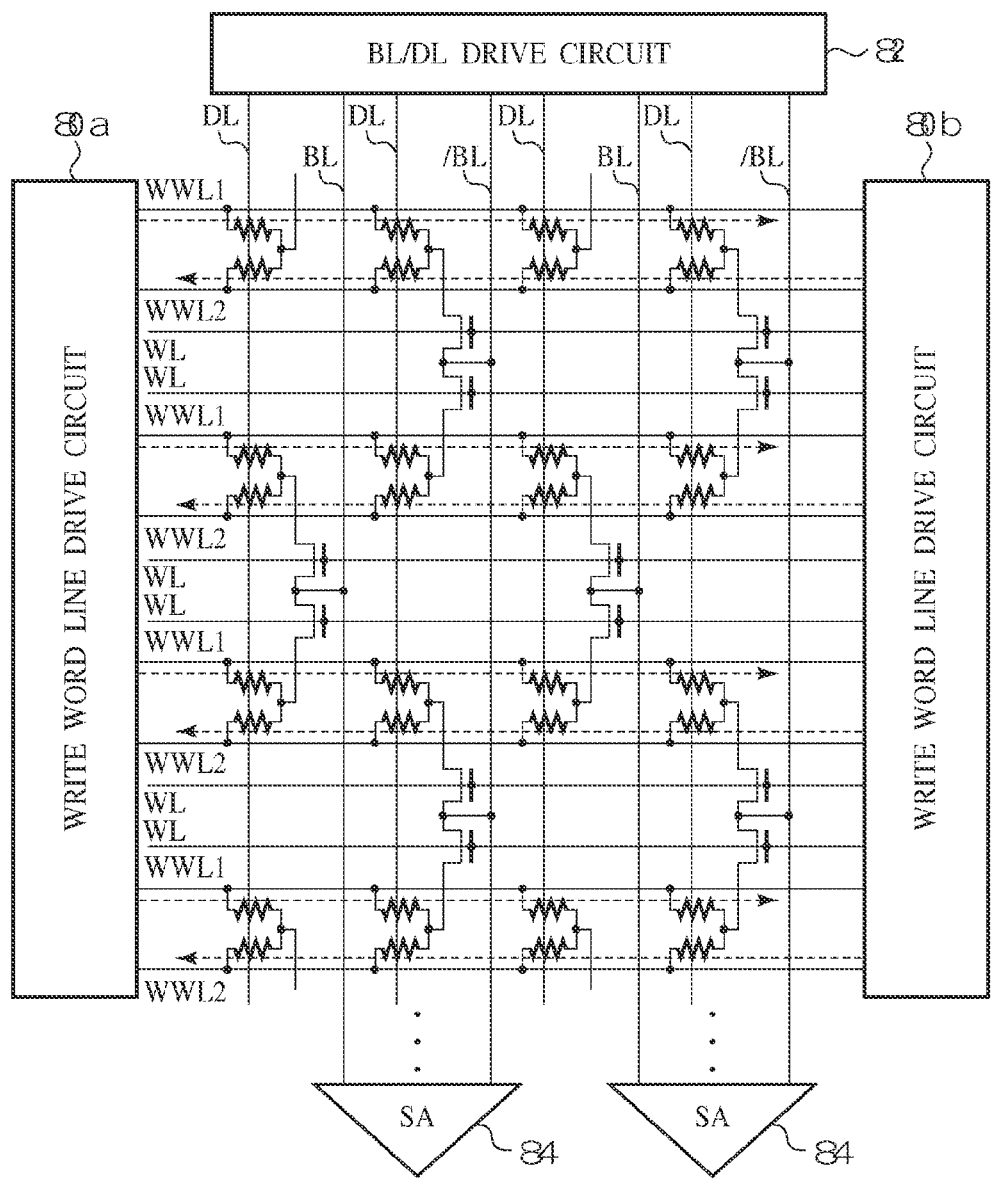

In the circuit shown in FIG. 7, at one ends of the write word lines WWL1, WWL2, the write word line drive circuit 80a is provided, and a the word line drive circuit 80b is provided at the other ends of the write word lines WWL1, WWL2.

The write word line drive circuit 80a, 80b are provided on both ends of the write word lines WWL1, WWL2, whereby the write current to the write word line WWL1 can be flowed by the write word line drive circuit 80a, and the write current to the write word line WWL2 can be flowed by the write word line drive circuit 80b. Thus, without providing the switching element 86, the oppositely-directed write currents can be easily flowed to the write word line WWL1, WWL2.

Figure 8:
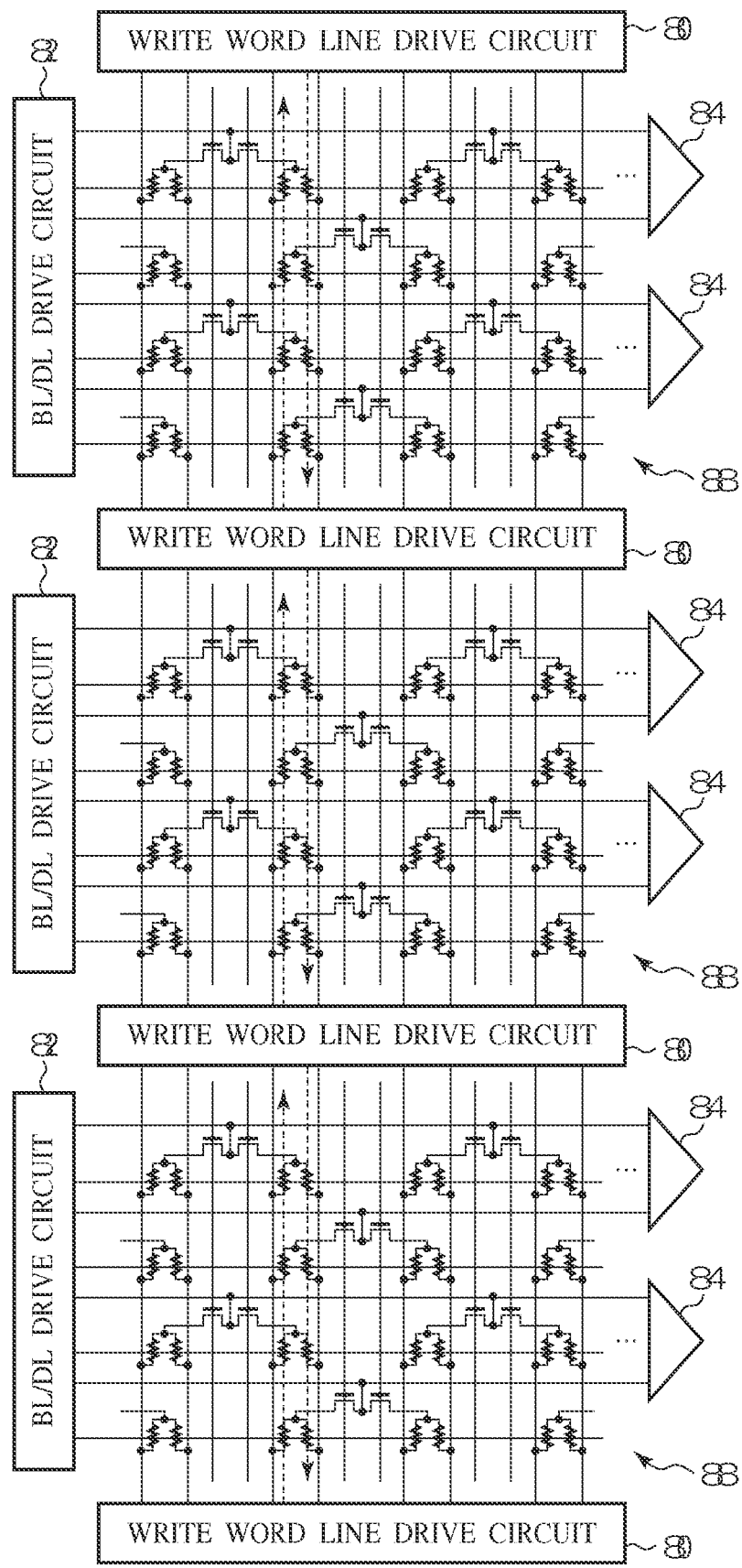

The circuit shown in FIG. 7 includes the write word line drive circuits 80a, 80b on both ends of the write word lines WWL1, WWL2, which seems to increase the memory cell area. Actually, however, as shown in FIG. 8, a plurality of memory cell blocks 88 are formed adjacent to each other, and the write word line drive circuits 80 are provided for each memory cell block 88. Accordingly, the write word line drive circuit provided between each memory cell blocks 88 and the adjacent one is used as a current generating circuit which supplies the currents to the write word lines of both memory cell blocks 88, whereby the circuit shown in FIG. 7 can be realized without increasing the memory cell area.

The method of writing into the magnetic memory device according to the present embodiment permits one column address (digit line) and a plurality of row addresses (write word lines) to be selected to make parallel writes in a plurality of the memory cells.

Figure 9:
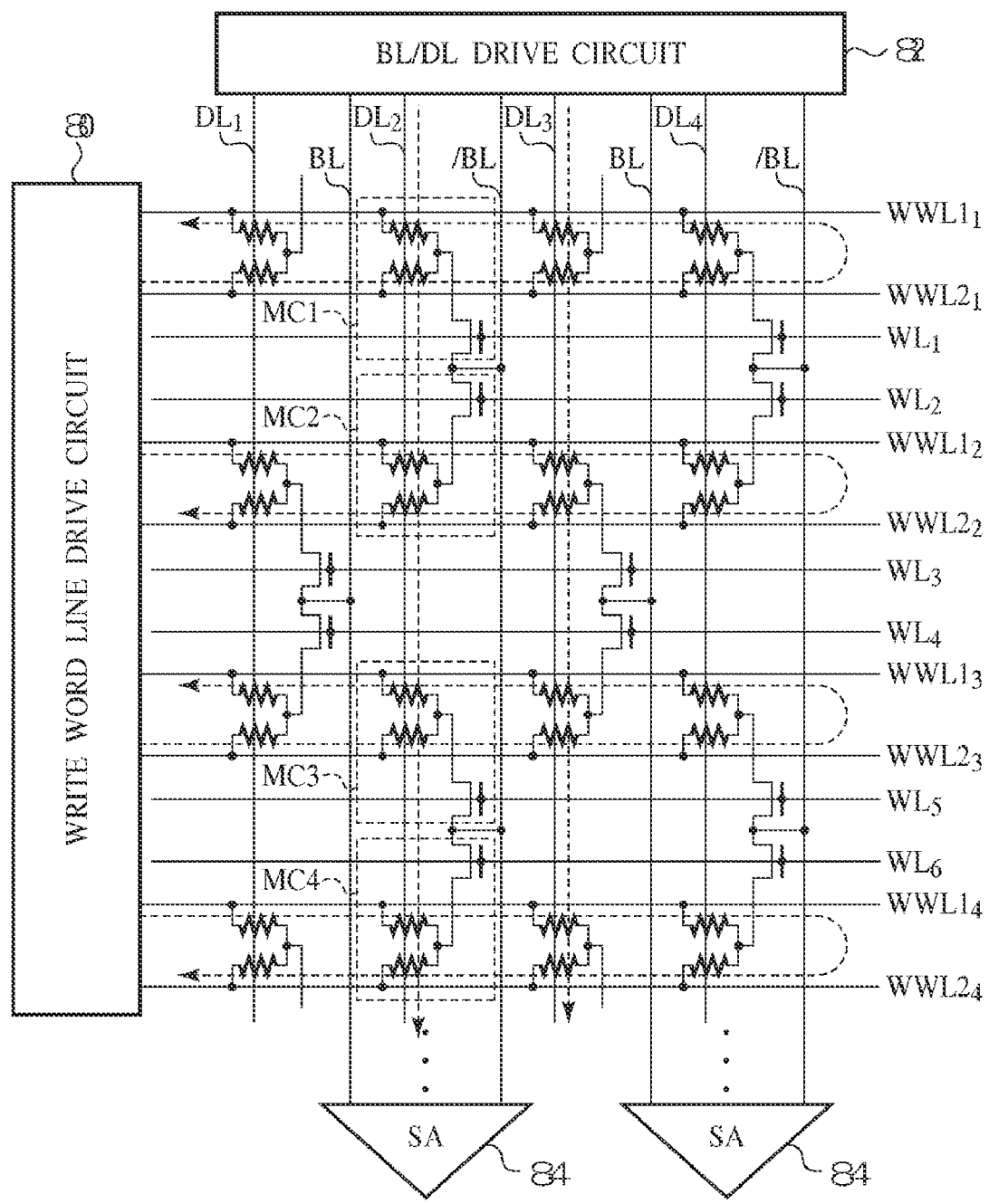
FIG. 9 is a circuit diagram showing the method of writing into the magnetic memory device according to the first embodiment of the present invention.

It is assumed here that in the circuit shown in FIG. 9, for the memory cells MC1, MC2, MC3 and MC4 using the common digit line DL2, data "1" is written into the memory cells MC1, MC2 and data "0" is written in the memory cells MC2, MC4.

In this case, to the write word line WWL$1_1$ connected to the memory cell MC1 data "1" is to be written in, the write current is flowed left in the drawing, and to the write word line WWL$2_1$, the write current is flowed right in the drawing. Similarly, to the write word line WWL$1_3$ connected to the memory cell MC3, the write current is flowed left in the drawing, and to the write word line WWL$2_3$, the write current is flowed right in the drawing.

On the other hand, to the write word line WWL$1_2$ connected to the memory cell MC2 data "0" is to be written in, the write current is flowed right in the drawing, and to the word line WWL$2_2$, the write current is flowed left in the drawing. Similarly, to the write word line WWL$1_4$ connected to the memory cell MC4, the write current is flowed right in the drawing, and to the write word line WWL$2_4$, the write current is flowed left in the drawing.

To the digit line DL$_2$, the write current is flowed downward in the drawing.

As described above, the directions of the write currents to be flowed in the write word lines WWL1, WWL2 connected to each memory cell MC are suitably changed, whereby arbitrary data can be simultaneously written in a plurality of memory cells MC connected to the common digit line DL.

Then, the column address is increased, and the same writing operation is made to write data in the entire memory array.

In the serial writing, in which writing operation is made sequentially in the memory cells one by one, one column address and one row address are selected to make writing in one memory cell. In the next writing cycle, the same row address is selected, and an increased column address is selected to make writing in the next one memory cell. After writing have been made in all the memory cells associated with the same row address, the row address is increased, and the same writing operation is made to write data in the entire memory cell array.

Next, the method of reading the magnetic memory device according to the present embodiment will be explained with reference to FIGS. 10 to 13.

In the magnetic memory device according to the present embodiment, the two MTJ elements 52 included in one memory cell are serially connected via the upper interconnection layer 60. To both ends of the two serially connected MTJ elements (MTJ1, MTJ2), the write word line WWL1 and write word line WWL2 are respectively connected. In the MTJ elements (MTJ1, MTJ2), complementary information is written.

Figure 10:
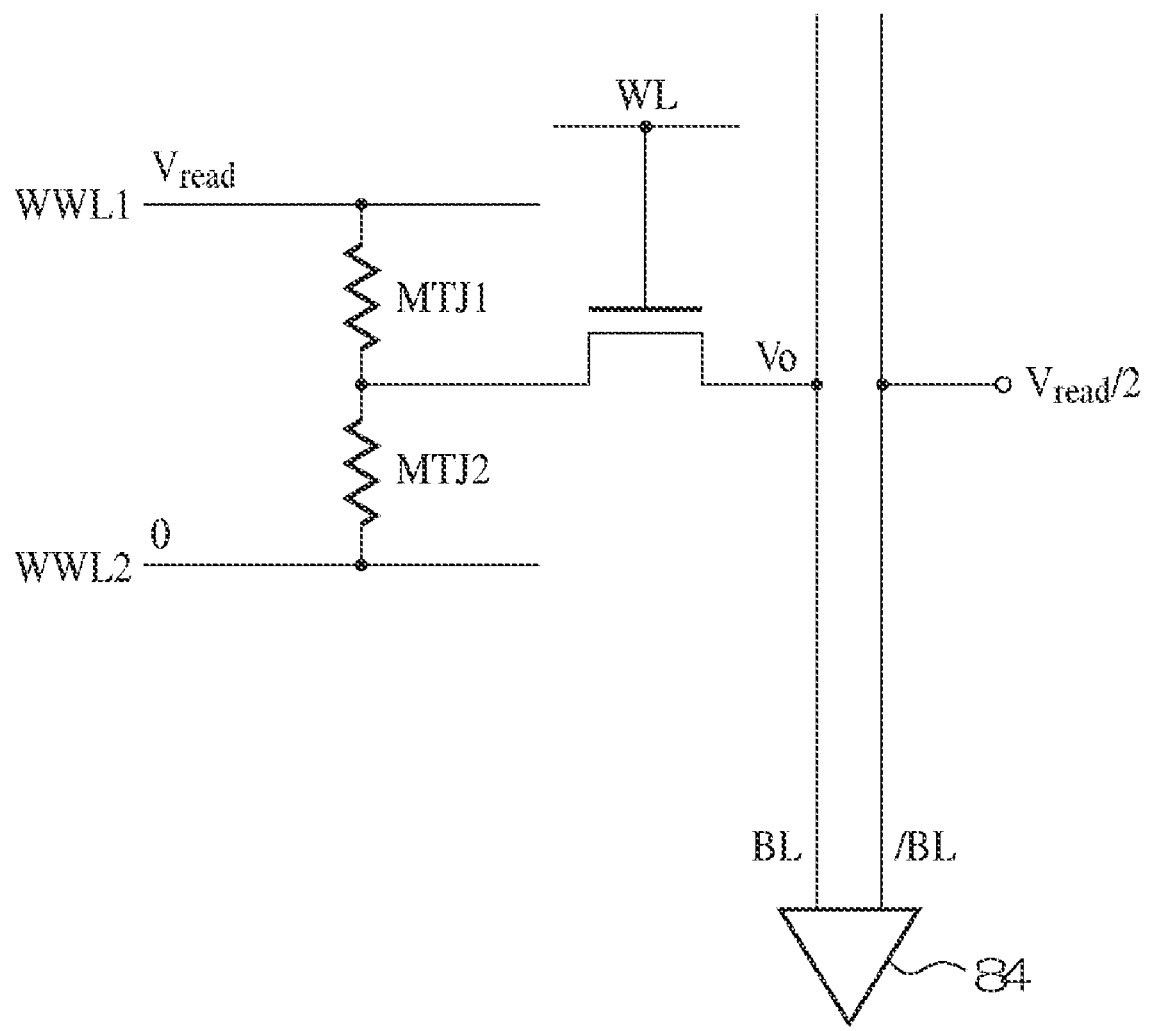
FIG. 10 is a circuit diagram showing the method of reading the magnetic memory device according to the first embodiment of the present invention.
Figure 11A:
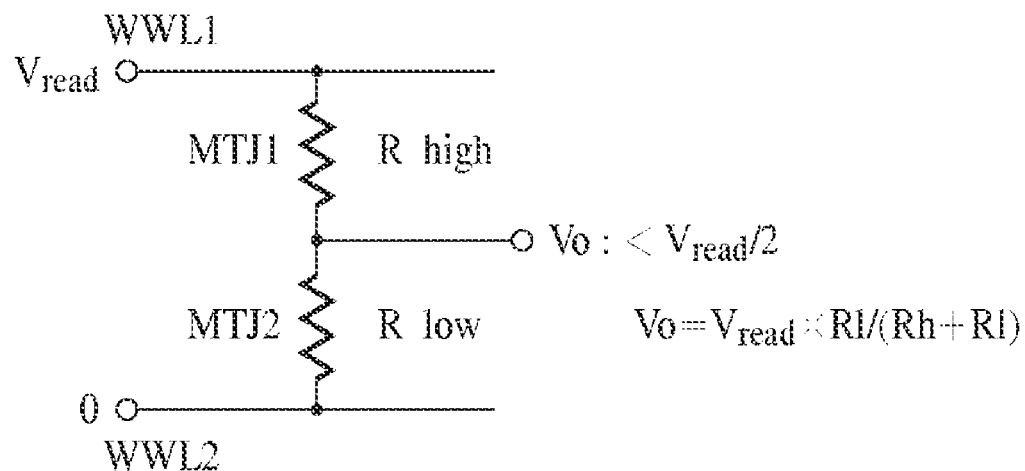
FIGS. 11A and 11B are views showing the method judging the memorized information of the magnetic memory device according to the first embodiment of the present invention.
Figure 11B:
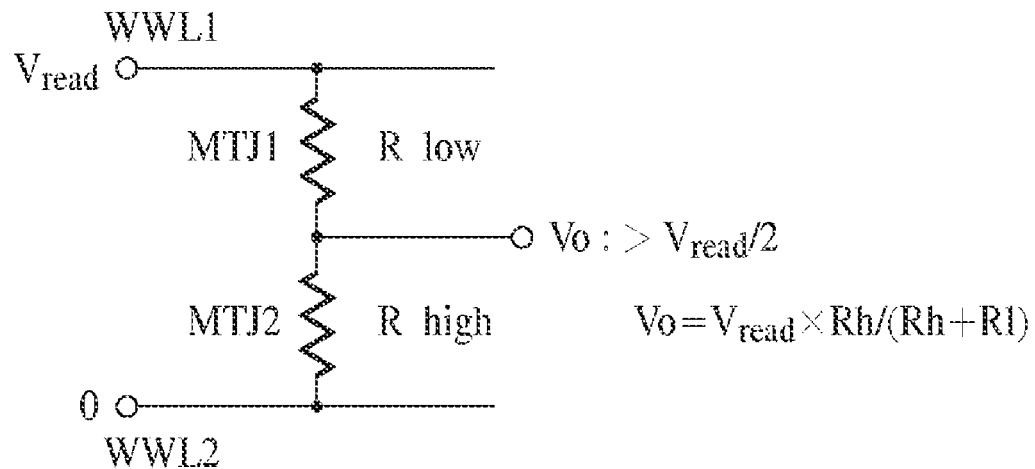

Then, in the reading of the magnetic memory device according to the present embodiment, as shown in FIG. 10, a read voltage $V_{read}$ is applied to the serial connection of the two MTJ elements (MTJ1, MTJ2) via the write word line WWL1 and the write word line WWL2 to read a voltage of the connection node between the MTJ element (MTJ1) and the MTJ element (MTJ2) at the bit line (BL) via the select transistor. At this time, the voltage to be applied to the word line WWL1 is $V_{read}$, and the voltage to be applied to the write word line WWL2 is 0. To the bit line (/BL) of the reference side, a constant voltage of $V_{read}/2$ is applied.

Then, the voltage of the bit line (BL) and the voltage of the bit line (/BL) of the reference side are compared with each other by a difference amplifier-type read sense circuit to read the information memorized in the MTJ elements.

When data is "0", e.g., the MTJ element (MTJ1) is in the high resistance state, and the MTJ element (MTJ2) is in the low resistance state, the voltage V0 of the connection node between the MTJ element (MTJ1) and the MTJ element (MTJ2) is lower than the voltage $V_{read}/2$. Accordingly, when the voltage of the bit line (BL) is lower than the voltage of the bit line (/BL) of the reference side, the information memorized in the memory cell can be judged data "0" (see FIG. 11A).

To the contrary, when data is "1", e.g., the MTJ element (MTJ1) is in the low resistance state, ad the MTJ element (MTJ2) is in the high resistance state, the voltage V0 of the connection node between the MTJ element (MTJ1) and the MTJ element (MTJ2) is higher than the voltage $V_{read}/2$. Accordingly, when the voltage of the bit line (BL) is higher than the voltage of the bit line (/BL) of the reference side, the information memorized in the memory cell can be judged data "1" (see FIG. 11B).

Next, the read circuit and the operation of the read circuit will be specifically explained with reference to FIGS. 12 and 13.

Figure 12:
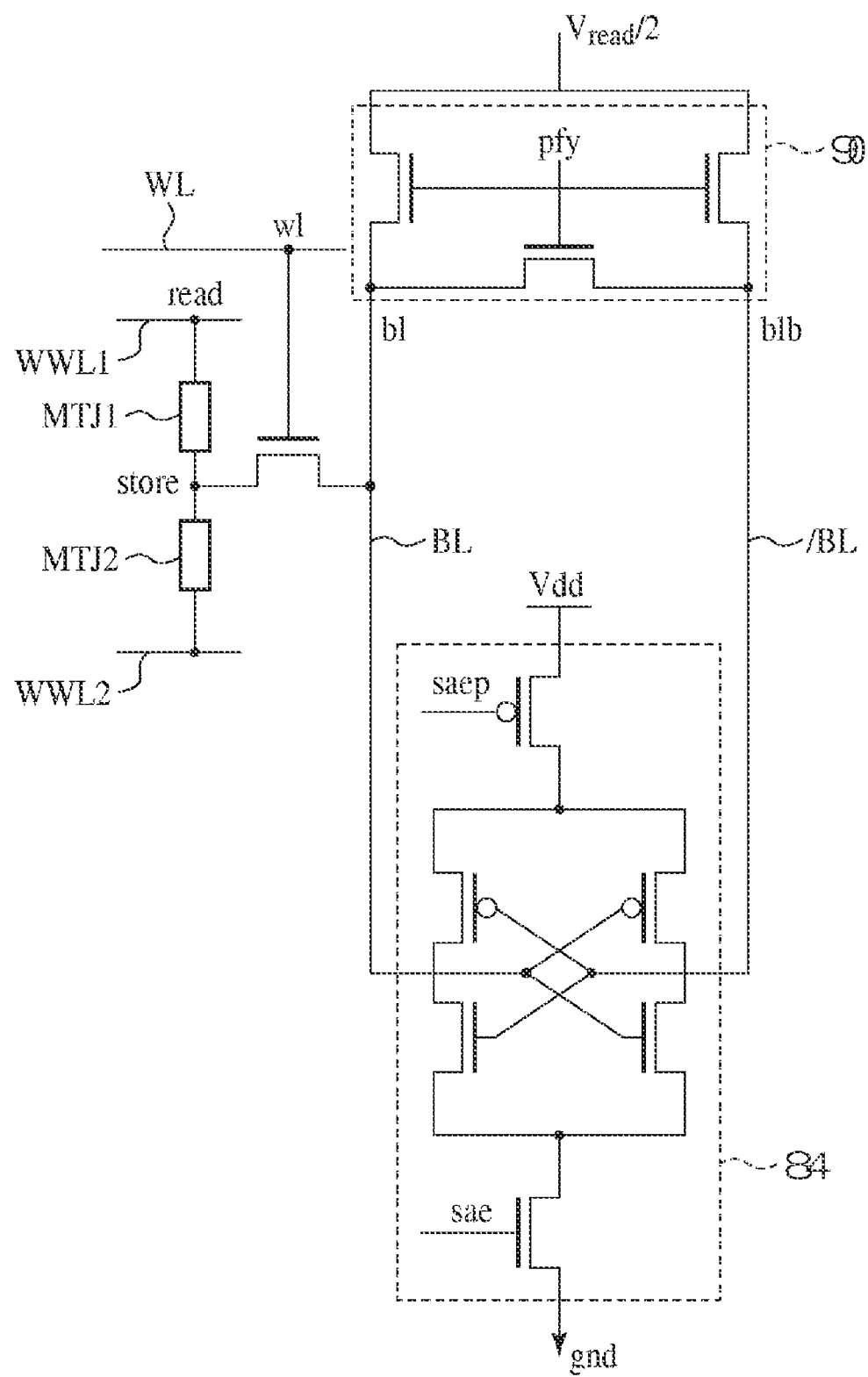
FIG. 12 is a circuit diagram showing one example of the memory cell and the read circuit of the magnetic memory device according to the first embodiment of the present invention.

FIG. 12 shows the memory cell and a circuit diagram of one example of the read circuit. As described above, the two MTJ elements (MTJ1, MTJ2) are serially connected, and the connection node of the MTJ elements (MTJ1, MTJ2) is connected to the bit line (BL) via the select transistor. One ends of the bit lines (BL, /BL) are connected to the difference amplifying-type sense amplifier 84. The sense amplifier shown in FIG. 12 is a cross connection-type sense amplifier used popularly in DRAM. The other ends of the bit lines (BL, /BL) are connected to a constant voltage source of $V_{read}/2$ via a precharge circuit 90 for precharging these signal lines.

Figure 13:
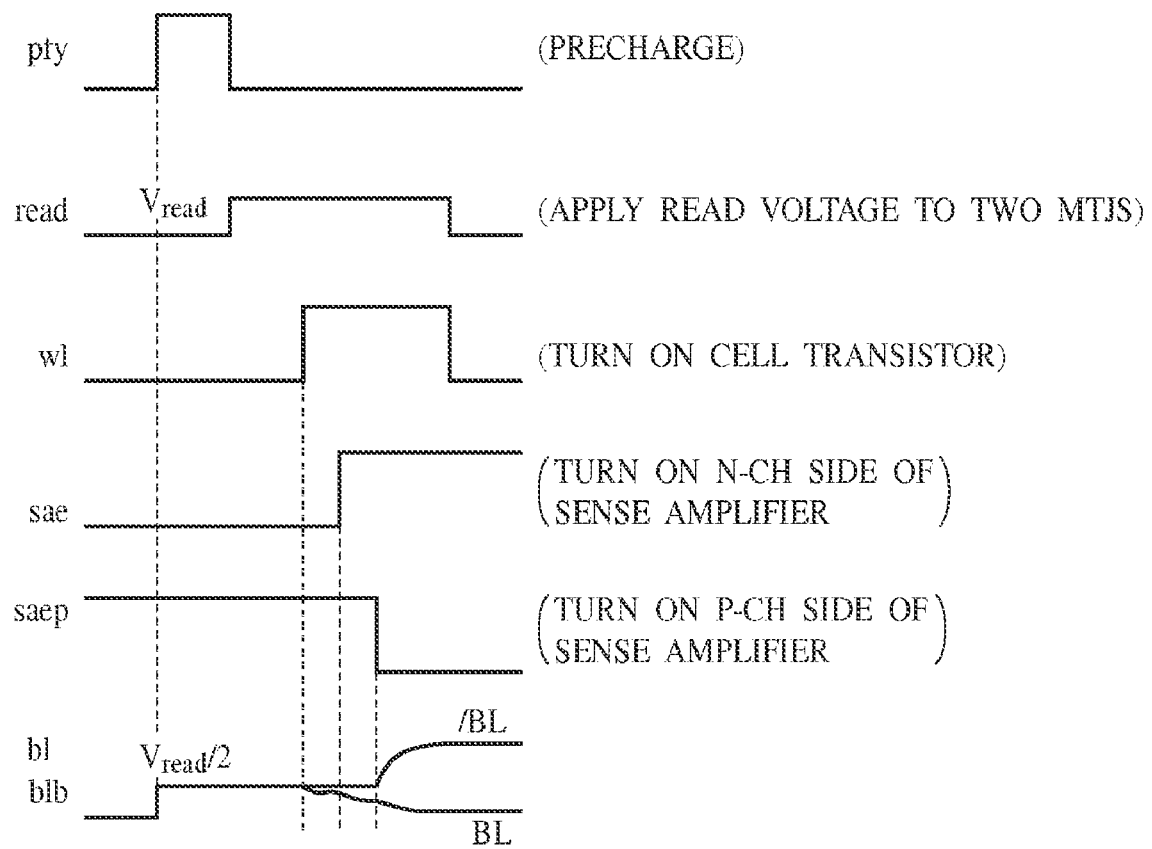
FIG. 13 is the time chart showing the timings of the read operation of the magnetic memory device according to the first embodiment of the present invention.

FIG. 13 is the timing chart showing the timings of the read operation. In the timing chart, "pfy" represents a voltage to be applied to a precharge circuit 90; "read" represents a voltage to be applied to the write word line WWL1; "wl" represents a voltage to be applied to the word line WL; "sae" represents a voltage to be applied to the n-channel transistor of the sense amplifier 84; "saep" represents a voltage to be applied to the p-channel transistor of the sense amplifier 84; "bl" is a voltage of the bit line (BL); and "blb" is a voltage of the bit line (BL) of the reference side. The signs of the respective nodes are described also in FIG. 12.

First, a control voltage for the precharge is applied to the control terminal (pfy) of the precharge circuit 90. This turns on all the transistors of the precharge circuit 90, and the bit line (BL) and the bit line (/BL) of the reference side are charged with the voltage $V_{read}/2$ supplied from the constant voltage source.

Next, after the bit line BL and the bit line (/BL) of the reference side have been precharged, the control voltage for the precharge applied to the control terminal (pfy) of the precharge circuit 90 is turned off.

Next, the read voltage $V_{read}$ is applied between the write word line WWL1 and the write word line WWL2. For example, the voltage ("read") of the write word line WWL1 is $V_{read}$, and the voltage of the write word line WWL2 is 0.

Then, a control voltage ("wl") for turning on the select transistor is applied to the word line WL. This turns on the select transistor, and the voltage ("bl") of the bit line becomes the voltage of the connection node of the two MTJ elements (MTJ1, MTJ2). The voltage of the bit line (/BL) of the reference side remains to be the voltage $V_{read}/2$.

In FIG. 13, it is assumed that data "0", i.e., the MTJ element (MTJ1) is in the high resistance state, and the MTJ element (MTJ2) is in the low resistance state. The voltage ("bl") of the bit line (BL) is lower than the voltage $V_{read}/2$. When data is "1", i.e., the MTJ element (MTJ1) is in the low resistance state, and the MTJ element (MTJ2) is in the high resistance state, the voltage ("bl") of the bit line BL is higher than the voltage $V_{read}/2$.

Next, with the voltages ("read", "wl") of the read word line WWL1 and the word line WL retained, the n-channel transistors and the p-channel transistors of the sense amplifier 84 are sequentially turned on. This raises the voltage of one of the bit line (BL) and the bit line (/BL) of the reference side, whose voltage is higher is raised to the source voltage Vdd, and the voltage of the other whose voltage is lower is lowered to the ground potential. Thus, which is higher or lower between the voltage of the bit line (BL) and the voltage of the bit line (/BL) of the reference side can be easily detected, and information memorized in the memory cell can be read.

In the 1T-2MTJ magnetic memory device, as described above, read margin can be increased, whereby the magnetic memory device can stably read even when the MTJ elements have characteristics fluctuated.

Next, the method of manufacturing the magnetic memory device according to the present embodiment will be explained with reference to FIGS. 14A to 14M.

Figure 14A:
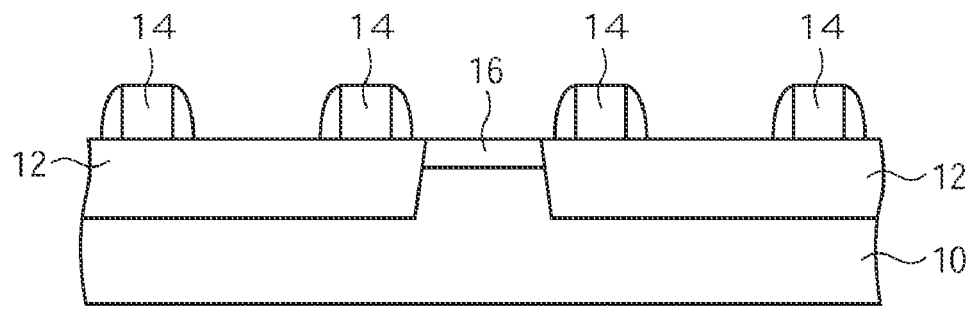
FIGS. 14A-14M are sectional views showing the method of manufacturing the magnetic memory device according to the first embodiment of the present invention.
Figure 14B:
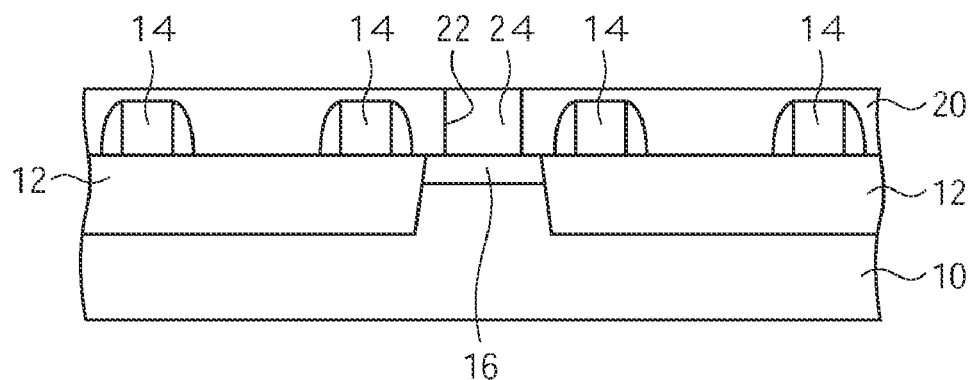
Figure 14C:
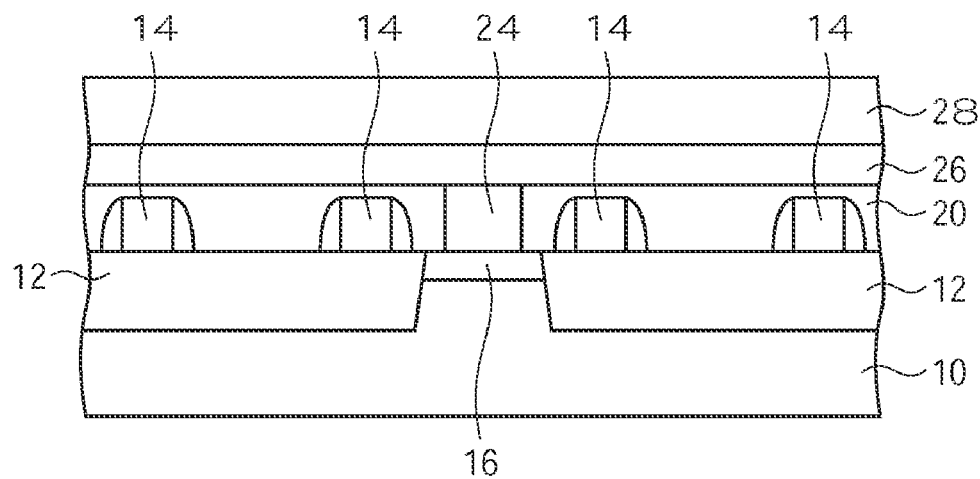

FIGS. 14A to 14M are sectional views showing the method of manufacturing the magnetic memory device according to the present embodiment. FIGS. 14A-14C are sectional views along the B-B' line in FIG. 1. FIGS. 14D to 14M are sectional views along the A-A' line in FIG. 1.

First, in the silicon substrate 10, the device isolation film 12 is formed by, e.g., Shallow Trench Isolation (STI) method. At this time, the active regions defined by the device isolation film 12 have a T-shape (see FIG. 1).

Figure 14D:
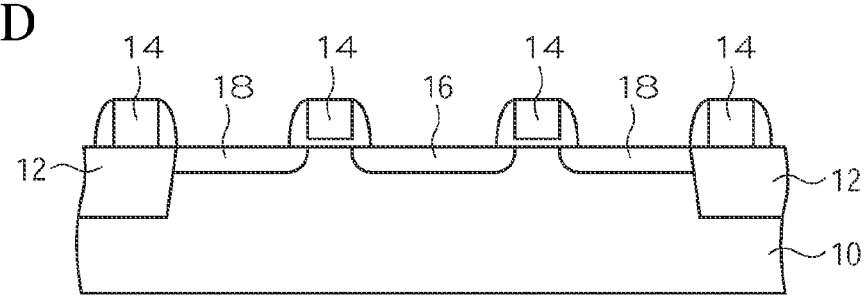

Next, in the active regions defined by the device isolation film 12, select transistors each including the gate electrode 14 and the source/drain regions 16, 18 are formed by the method of manufacturing the usual MOS transistor (FIG. 14A and FIG. 14D). Two select transistors are formed in each active region. The gate electrode 14 is formed extending in the direction perpendicular to the drawing and forms a word line WL which functions also as the gate electrodes 14 of the plurality of the select transistors as shown in FIG. 1.

Next, over the silicon substrate 10 with the select transistors formed on, a silicon oxide film is deposited by, e.g., chemical vapor deposition (CVD) method, and the surface of the silicon oxide film is planarized by chemical mechanical polishing (CMP) method to form the inter-layer insulating film 20 of the silicon oxide film.

Next, by photolithography and dry etching, the contact holes 22 down to the source/drain regions 16 are formed in the inter-layer insulating film 20.

Figure 14E:
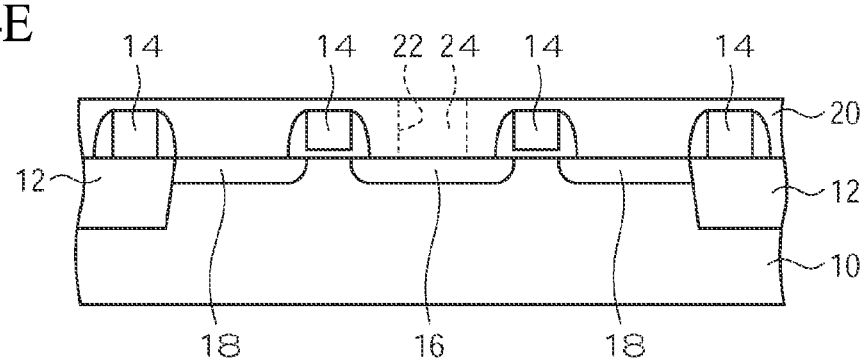

Next, by, e.g., CVD method, a titanium nitride film as a barrier metal and a tungsten film are deposited, and then these conductive films are etched back or polished back to form the contact plugs 24 buried in the contact holes 22 and electrically connected to the source/drain regions 16 (FIG. 14B and FIG. 14E).

Then, a conductive film is deposited on the inter-layer insulating film 20 with the contact plugs 24 buried in and is patterned to form the bit lines 26 electrically connected to the source/drain regions 16 via the contact plugs 24. As shown in FIG. 1, the bit lines 26 (BL) are formed, extended crossing the word lines WL.

Figure 14F:
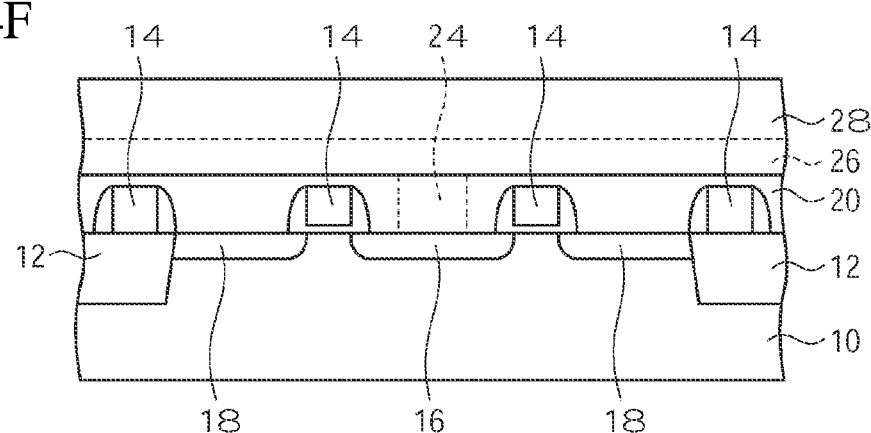

Next, over the inter-layer insulating film 20 with the bit lines 26 formed on, a silicon oxide film is deposited by, e.g., CVD method, and the surface of the silicon oxide film is planarized by CMP method to form the inter-layer insulating film 28 of the silicon oxide film (FIG. 14C and FIG. 14F).

Figure 14G:
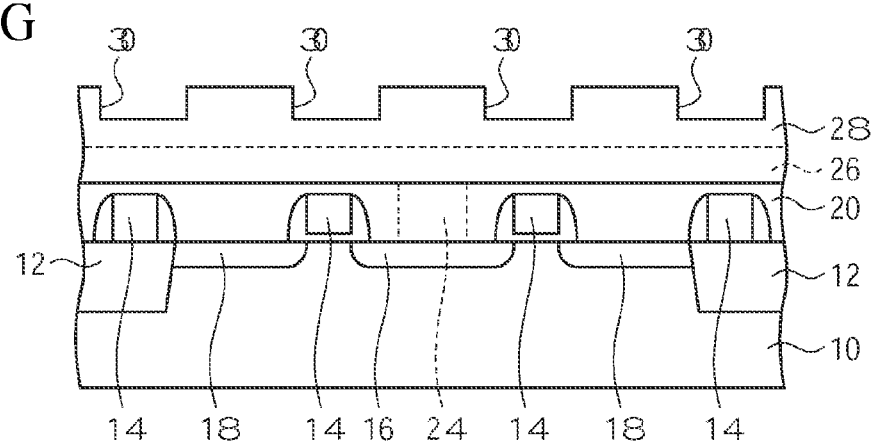

Next, by photolithography and dry etching, the interconnection trenches 30 for burying the write word lines are formed in the inter-layer insulating film 28 (FIG. 14G).

Figure 14H:
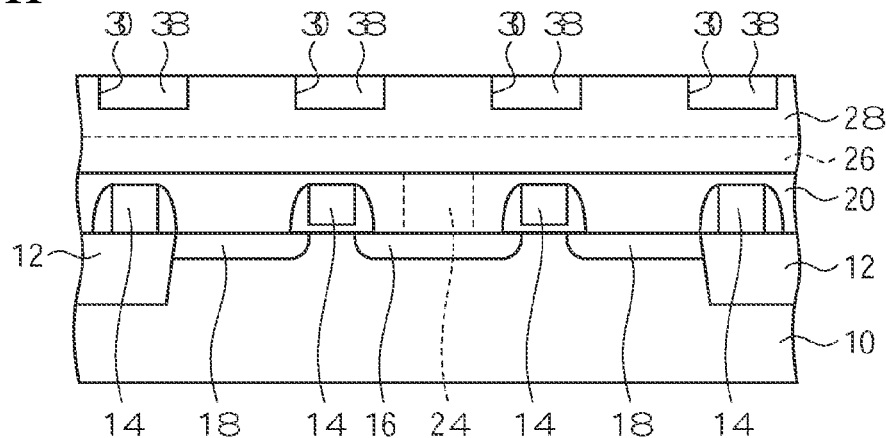

Next, a Ta film 32 and a NiFe film 34 are deposited by, e.g., sputtering method, and by, e.g., electroplating method, a Cu film 36 is deposited. Then, these conductive films are planarized by CMP method to form the write word lines 38 buried in the interconnection trenches 30 (FIG. 3 and FIG. 14H). As shown in FIG. 1, the write word lines 38 (WWL) are formed, extended in parallel with the word lines WL.

Then, over the inter-layer insulating film 28 with the write word lines 38 buried in, the lower electrode layer 40 of, e.g., Ta film, the anti-ferromagnetic layer 42 of, e.g., PtMn, the pinned magnetization layer 44 of, e.g., CoFe, the tunnel insulating film 46 of, e.g., alumina, the free magnetization layer 48 of, e.g., CoFe and the cap layer 50 of, e.g., Ta film are formed by, e.g., sputtering method.

Figure 14I:
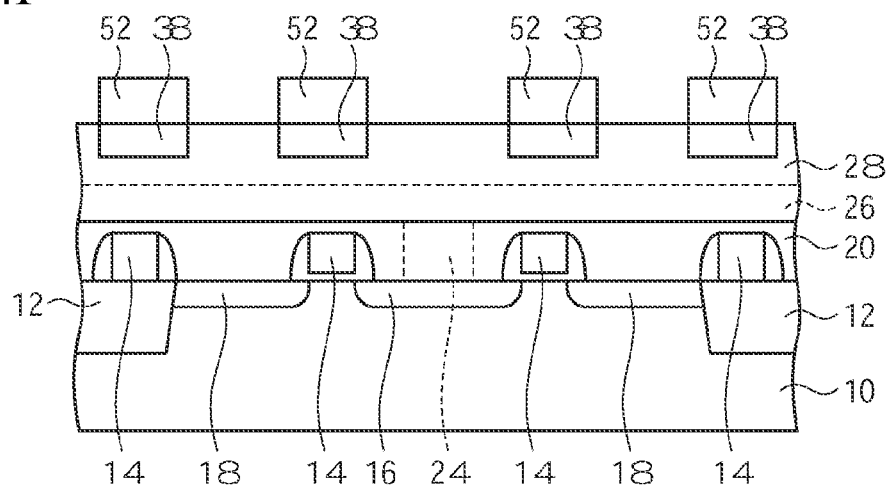

Next, by photolithography and dry etching, the cap layer 50, the free magnetization layer 48, the tunnel insulating film 46, the pinned magnetization layer 44, the anti-ferromagnetic layer 42 and the lower electrode layer 40 are patterned to form the MTJ elements 52 connected to the write word lines 38 (FIG. 3 and FIG. 14I). Here, for patterning the cap layer 50 and the lower electrode layer 40, an etching gas of, e.g., $Cl_2/Ar$ group may be used, and for patterning the free magnetization layer 48, the tunnel insulating film 46, the pinned magnetization layer 44 and the anti-ferromagnetic layer 42, an etching gas of, e.g., $CO/NH_3$ group may be used.

Figure 14J:
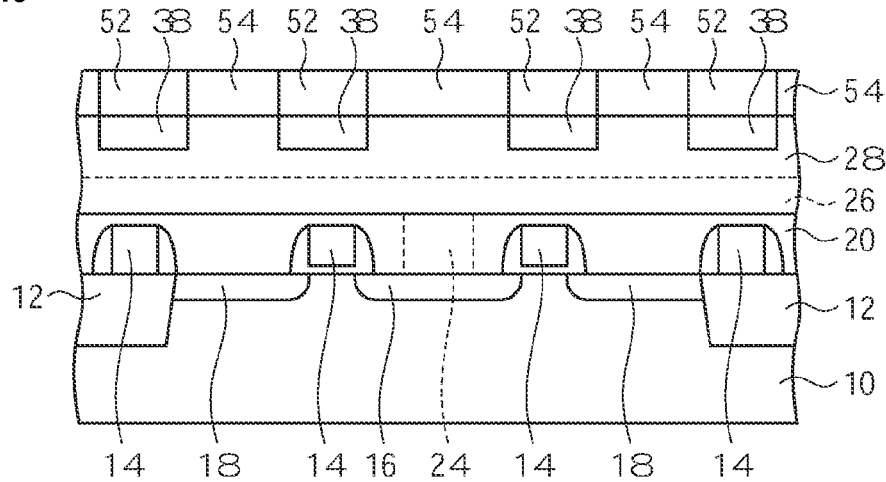

Then, over the inter-layer insulating film 28 with the MTJ elements 52 formed on, a silicon oxide film is deposited by, e.g., CVD method, and the silicon oxide film is planarized by CMP method until the MTJ elements 52 are exposed to form the inter-layer insulating film 54 of the silicon oxide film having the surface planarized (FIG. 14J).

Next, by photolithography and dry etching, the contact holes 56 down to the source/drain regions 18 are formed in the inter-layer insulating films 54, 28, 20.

Figure 14K:
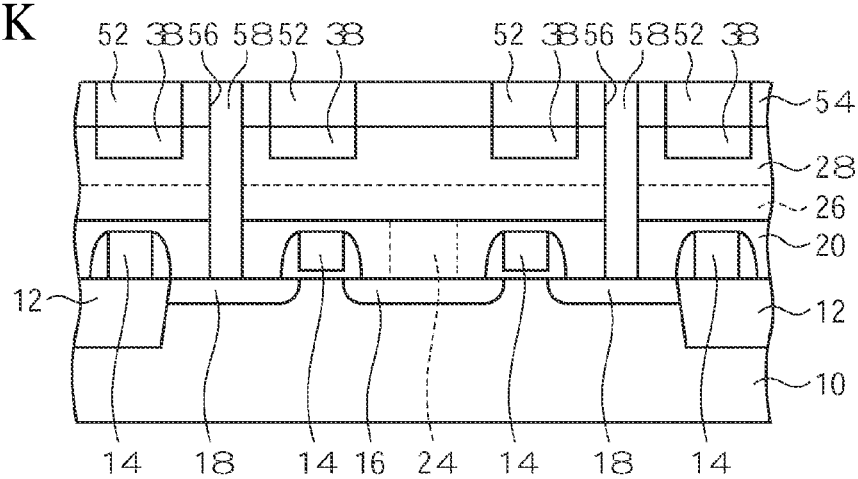

Then, by, e.g., CVD method, a titanium nitride film as a barrier metal and a tungsten film are deposited, and these conductive films are etched back or polished back to form the contact plugs 58 buried in the contact holes 46 and electrically connected to the source/drain regions 18 (FIG. 14K).

Figure 14L:
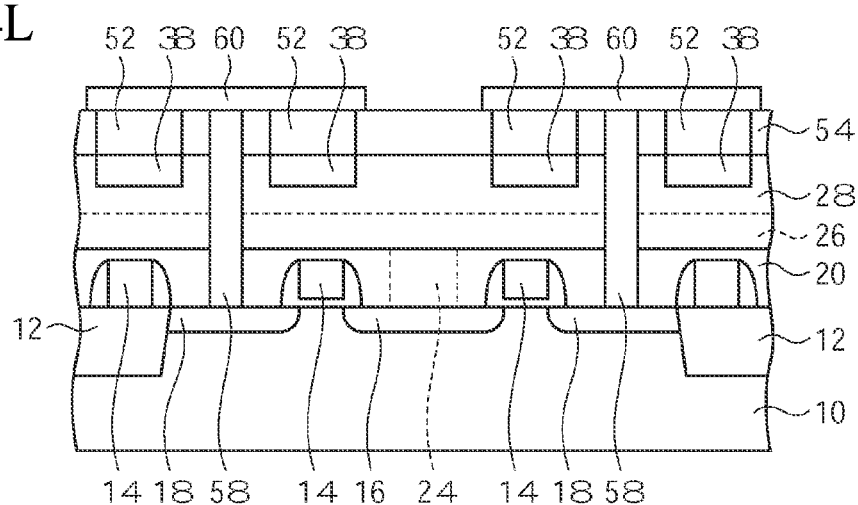

Next, over the inter-layer insulating film 54 with the MTJ elements 52 and the contact plugs 58 buried in, a Ta film is deposited by, e.g., sputtering method and patterned. Thus, the upper electrode layer 60 formed of the Ta film, electrically connected to the source/drain regions 18 via the contact plugs 58 and parallelly connecting the MTJ elements 52 adjacent to the contact plugs 58 is formed (FIG. 14L). For patterning the upper electrode 60, an etching gas of, e.g., $Cl_2/Ar$ group may be used.

Then, over the inter-layer insulating film 54 with the upper electrode layer 60 formed on, a silicon oxide film is deposited by, e.g., CVD method, and the surface of the silicon oxide film is planarized by CMP method to form the inter-layer insulating film 62 of the silicon oxide film.

Figure 14M:
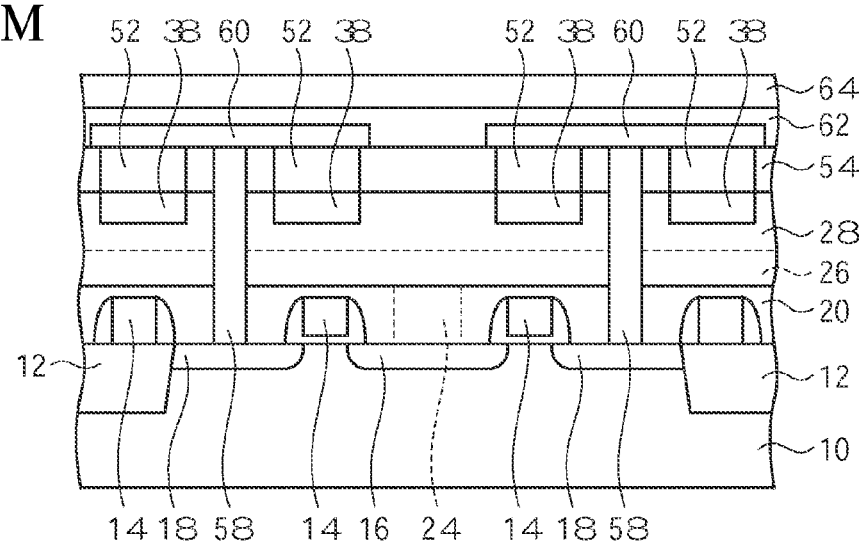

Then, a conductive film is deposited on the inter-layer insulating film 62 and patterned to form the digit lines 64 (DL) (FIG. 14M). As shown in FIG. 1, the digit lines 64 are formed in regions between the bit lines BL and extended in parallel with the bit lines.

Then, upper-level interconnection layers, etc. as required are formed, and the magnetic memory device according to the present embodiment is completed.

As described above, according to the present embodiment, the memory cell includes two magnetoresistance effect elements serially connected to each other, and a select transistor connected to the connection node of these magnetoresistance effect elements, and the information memorized in the magnetoresistance effect elements is read based on a voltage of the connection node of the first magnetoresistance effect element and the second magnetoresistance effect element, which is outputted to the bit line connected to the connection node, which facilitates the integration in comparison with the conventional magnetic memory device using the current sense method.

In writing information in the memory cell, information to be memorized is switched by direction of the write currents flowed in the two write word lines, whereby complementary resistance states can be stably and surely written in the two magnetoresistance effect elements in comparison with the method of switching write currents to be flowed to the digit line.

A Second Embodiment

The magnetic memory device and method of writing into the same according to a second embodiment of the present invention will be explained with reference to FIGS. 15 to 20G. The same members of the present embodiment as those of the magnetic memory device and the method of writing into the same according to the first embodiment shown in FIGS. 1 to 14M are represented by the same reference numbers not to repeat or to simplify their explanation.

First, the structure of the magnetic memory device according to the present embodiment will be explained with reference to FIGS. 15 to 17.

In a silicon substrate 10, a device isolation film 12 for defining on the surface thereof a plurality of active regions is formed. The active regions have a rectangular shape elongated in the X-direction. These plural active regions are arranged zigzag to each other.

Over the silicon substrate 10 with the device isolation film 12 formed in, a plurality of word lines WL extended in the Y-direction are formed. The word lines WL are extended two in each active region. In the active regions on both sides of the each word line WL, source/drain regions 16, 18 are formed. Thus, in each active region, two select transistors each including a gate electrode 14 functioning also as the word line WL, and the source/drain regions 16, 18 are formed. The two select transistors formed in one active region have the source/drain region 16 in common.

Over the silicon substrate 10 with the select transistors formed on, an inter-layer insulating film 20 is formed. In the inter-layer insulating film 20, a plurality of write word lines 38 (WWL) extended in the X-direction are buried. As shown in FIG. 15, the write word lines 38 are arranged, two adjacent ones (WWL) sandwiching device regions.

Over the inter-layer insulating film 20 with the write word lines 38 buried in, MTJ elements 52 are formed. As shown in FIG. 15, the MTJ elements 52 are formed each on the write word line 38 (WWL) in the region sandwiched by the adjacent word lines 14 (WL).

Over the inter-layer insulating film 20 except that in the regions where the MTJ elements are formed, an inter-layer insulating film 28 is formed. In the inter-layer insulating films 28, 20, contact plugs 58 connected to the source/drain regions 18 are buried. Over the inter-layer insulating film 28, an upper electrode layer 60 electrically connecting two of the MTJ elements, which are adjacent to each other in the Y-direction with the contact plug 58 therebetween, and the contact plug 58 are formed.

Over the inter-layer insulating film 28 with the upper electrode layer 60 formed on, an inter-layer insulating film 54 is formed. Over the inter-layer insulating film 54, a plurality of digit lines 64 (DL) extended in the Y-direction are formed. The digit lines 64 are formed, crossing the MTJ elements 52 arranged in the Y-direction thereabove. The extending direction (Y-direction) of the digit lines 64 (DL) are in parallel with the easy magnetization inversion axis (the major axis) of the MTJ elements.

Over the inter-layer insulating film 54 with the digit lines 64 formed on, an inter-layer insulating film 62 is formed. In the inter-layer insulating films 62, 54, 28, 20, contact plugs 24 connected to the source/drain regions 16 are buried. Over the inter-layer insulating film 64, a plurality of bit lines 26 (BL) extended in the X-direction and electrically connected to the source/drain regions 16 via the contact pugs 24 are formed.

As described above, the magnetic memory device according to the present embodiment is the same as the magnetic memory device according the first embodiment in having 1T-2MTJ type that one memory cell has one select transistor and two MTJ elements. The major characteristic of the magnetic memory device according to the present embodiment is that the write word line WWL are formed, extended in the X-direction, and the digit lines DL are formed, extended in the Y-direction. In the magnetic memory device according to the first embodiment, the write word lines WWL are formed, extended in the Y-direction, and the digits lines DL are formed, extended in the X-direction, and the extending directions of these interconnections are opposite to those of the magnetic memory device according to the present embodiment.

Figure 17:
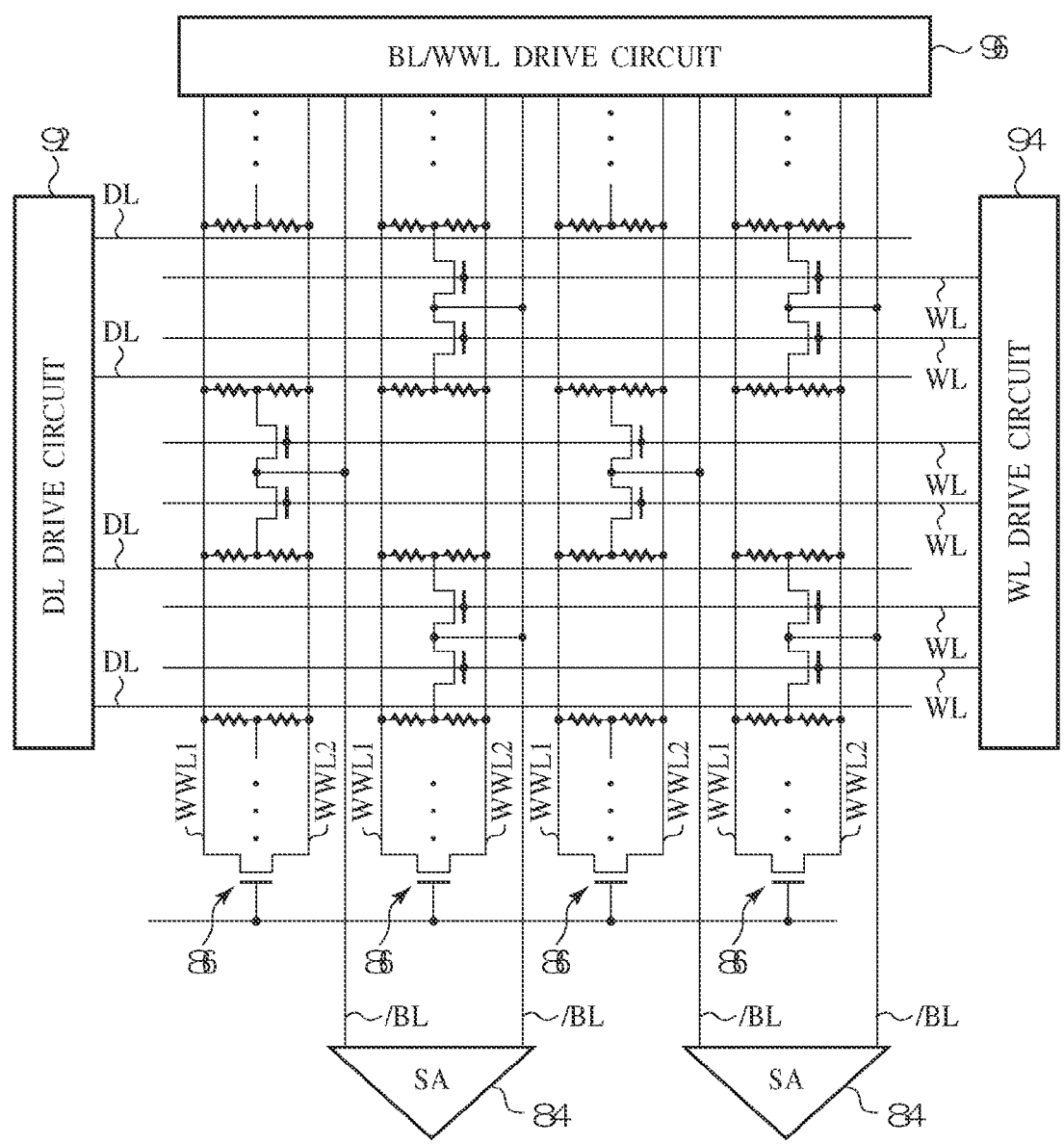
FIG. 17 is a circuit diagram showing the structure of the magnetic memory device according to the second embodiment of the present invention.

FIG. 17 is the circuit diagram of the memory cell array of the magnetic memory device according to the present embodiment. As shown in FIG. 17, the digit lines DL are connected to a digit line (DL) drive circuit 92. The word lines WL are connected to a word line (WL) drive circuit 94. To one ends of the write word lines WWL and the bit lines (BL, /BL), a bit line/write word line (BL/WWL) drive circuit 96 is connected. The BL/WWL drive circuit 96 includes a write current generating circuit for supplying a write current to the write word lines WWL upon writing, a read voltage generating circuit for applying a read voltage to the word lines WWL upon reading, and a reference voltage generating circuit for applying a reference voltage to the bit lines (/BL) upon reading.

To the other ends of the bit lines (BL, /BL) sense amplifier 84 are connected. To each sense amplifier 84, two adjacent bit lines BL are connected, and the bit lines BL, /BL form a folded bit line structure in which the adjacent bit lines BL, /BL are inputted to the sense amplifier.

To the other ends of the write word lines WWL, switching elements 96 for connecting and disconnecting the write word lines WWL1 and the write word lines WWL2 are provided.

In the magnetic memory device according to the present embodiment, the first metal interconnections are the write word lines WWL, the second metal interconnections are the digit lines DL, the third metal interconnections are the bit lines BL, and the area of the unit memory cell is $4F \times 4F = 16F^2$.

Next, the method of writing into the magnetic memory device according to the present embodiment will be explained with reference to FIG. 18.

The magnetic memory device according to the present embodiment includes the same 1T-2MTJ-type memory cells as the magnetic memory device according to the first embodiment, and the basic writing method is the same as that of the magnetic memory device according to the first embodiment.

That is, a synthetic magnetic field of magnetic field generated by write currents flowed to the write word lines WWL, WWL2 and a magnetic field generated by a write current flowed to the digit line DL is applied to the respective two MTJ elements included in one memory cell to thereby write required data in the memory cell. To the write word line WWL1 connected to the one MTJ element (MTJ1) and the write word line WWL2 connected to the other MTJ element (MTJ2), write currents which are directed opposite to each other are flowed. Thus, resistance states which are complementary with each other can be written in the MTJ elements MTJ1, MTJ2. Data to be written is set by switching directions of currents to be flowed to the write word lines WWL1, WWL2.

The major characteristics of the magnetic memory device according to the present embodiment is that one row address (digit line) and a plurality of column addresses (write word lines) are selected to make parallel writing in the plural memory cells. Such writing/reading sequence is applied to the general memory devices and has good conformity with the peripheral circuits, writing programs, etc.

Figure 18:
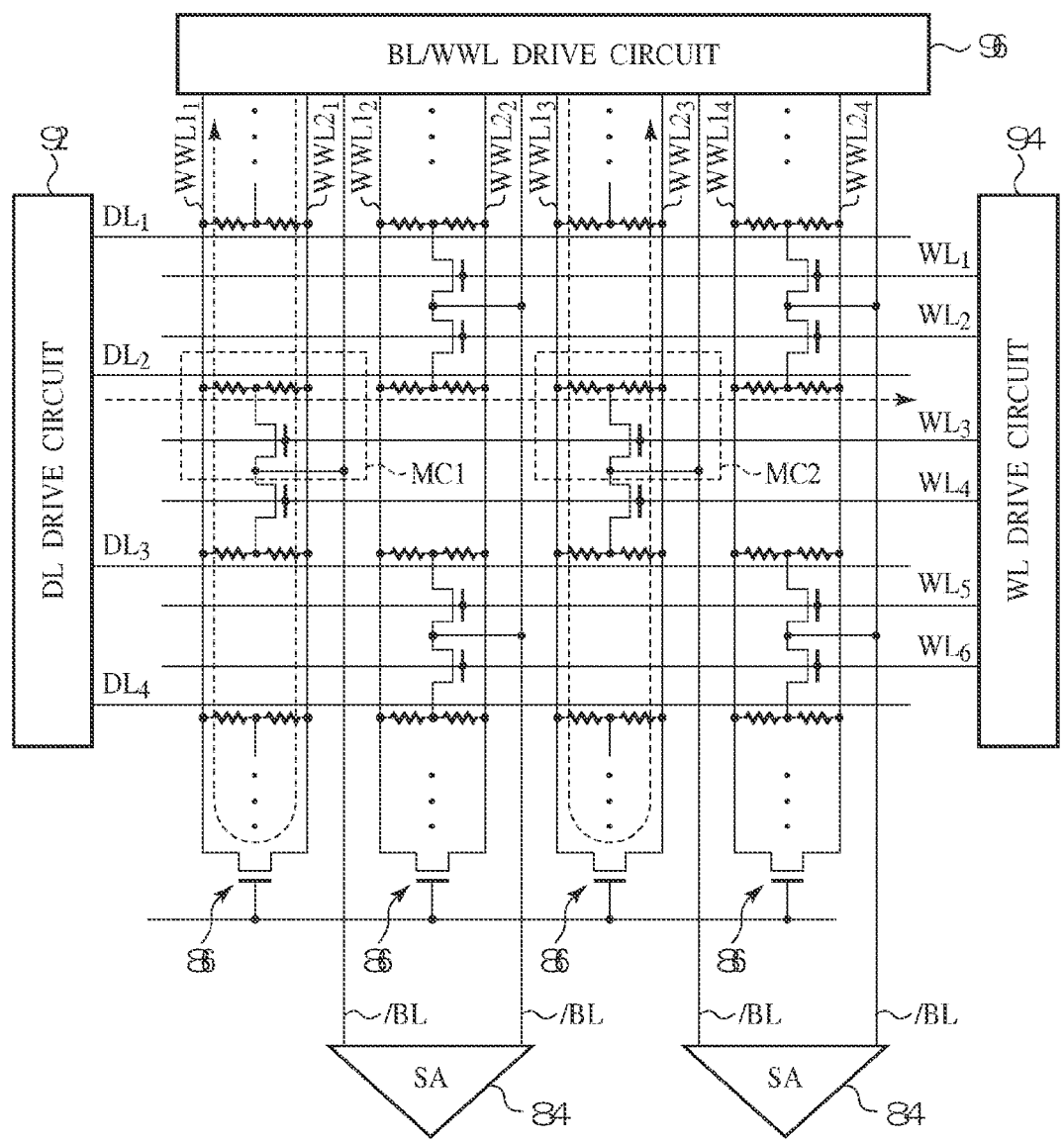
FIG. 18 is a circuit diagram showing the method of writing into the magnetic memory device according to the second embodiment of the present invention.

In the circuit shown in FIG. 18, it is assumed that in the memory cells MC1, MC2 connected to the common word line $WL_3$, data "0" is to be written in the former, and in the latter, data "1" is to be written.

In this case, to the write word line $WWL1_1$ connected to the memory cell MC1 where the data "0" is to be written, a write current is flowed upward as viewed in the drawing, and to the write word line $WWL2_1$, a write current directed downward as viewed in the drawing.

On the other hand, to the write word line $WWL1_3$ connected to the memory cell MC2 where the data "1" is to be written, a write current is flowed downward as viewed in the drawing, and to the write word line $WWL2_3$, a write current is flowed upward as viewed in the drawing.

To the digit line DL2, a write current is flowed right as viewed in the drawing.

As described above, the directions of the write currents to be flowed in the write word lines WWL1, WWL2 connected to the respective memory cells MC1, MC2 are suitably changed, whereby arbitrary data can be simultaneously written in plurality memory cells MC connected to the common word lines WL.

Then, the row address is increased, and the same writing operation is made to write data in the entire memory cell array.

In the serial writing, which writes memory cells sequentially one by one, one column address and one row address are selected to write in one memory cell. In the next writing cycle, the same row address is selected, and an increased column address is selected to write in the next one memory cell. After writing have been made in all the memory cells associated with the same row address, the row address is increased to make the same writing, and data writing are made in the entire memory cell array.

The method of reading the magnetic memory device according to the present embodiment is the same as the method of reading the magnetic memory device according to the first embodiment.

Next, the method of manufacturing the magnetic memory device according to the present embodiment will be explained with reference to FIGS. 19A to 20G. FIGS. 19A-19G are the sectional view along the line A-A' in FIG. 15, and FIGS. 20A-20G are the sectional view along the line B-B' in FIG. 15. FIGS. 19A-19G correspond to FIGS. 20A-20G, respectively.

First, in the silicon substrate 10, the device isolation film 12 is formed by, e.g., STI method. At this time, the active regions defined by the device isolation film have a rectangular shape (I shape) elongated in the X-direction (see FIG. 15).

Figure 19A:
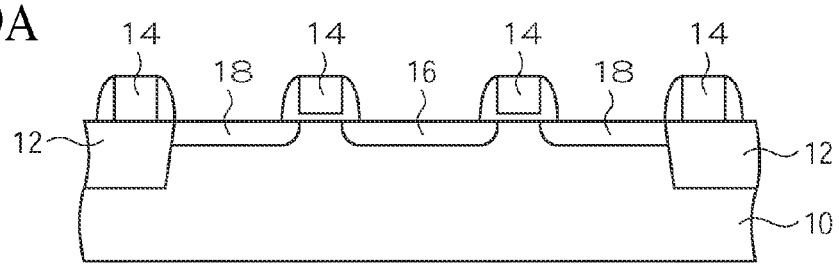
FIGS. 19A-19G and 20A-20G are sectional views showing the method of manufacturing the magnetic memory device according to the second embodiment of the present invention.
Figure 20A:
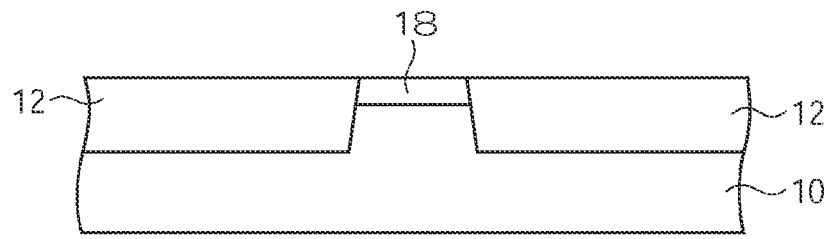

Then, in the active regions defined by the device isolation film 12, the select transistors each including the gate electrode 14 and the source/drain regions 16, 18 are formed by the same method of manufacturing the usual MOS transistor (FIG. 19A and FIG. 20A). The select transistors are formed two in each active region. The gate electrodes 14 are formed, extended vertically as viewed in the drawing to form, as shown in FIG. 15, the read word lines WL functioning also as the gate electrodes 14 of the plural select transistors.

Next, over the silicon substrate 10 with the select transistors formed on, a silicon oxide film is deposited by, e.g., CVD method, and the surface of the silicon oxide film is planarized by CMP method to form the inter-layer insulating film 20 of the silicon oxide film.

Then, the interconnection trenches 30 for the write word lines to be buried in are formed in the inter-layer insulating film 20 by photolithography and etching.

Figure 19B:
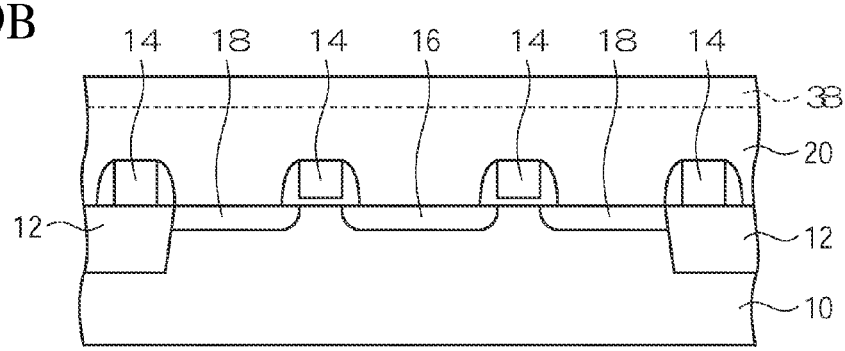
Figure 20B:
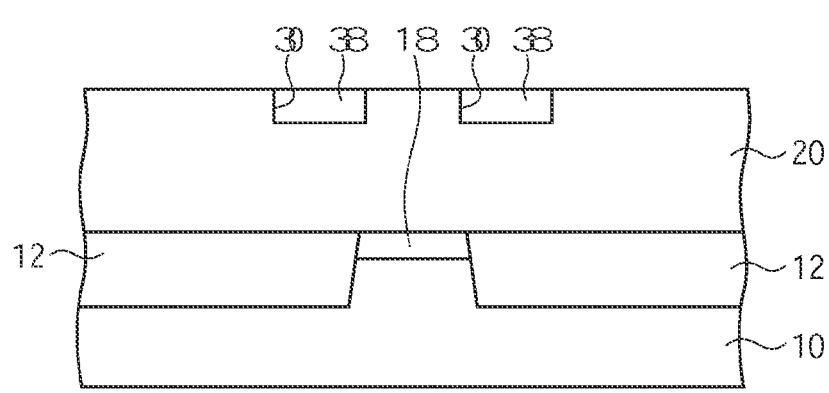

Next, a Ta film and an NiFe film are deposited by, e.g., sputtering method, and by, e.g., electroplating method, a Cu film is deposited. Then these conductive films are planarized by CMP method to form the write word lines 38, buried in the interconnection trenches 30 (FIG. 19B, FIG. 20B and FIG. 3). As shown in FIG. 15, the write word lines 38 (WWL) are formed, extended crossing the word lines WL.

Next, over the inter-layer insulating film 20 with the write word lines 38 buried in, the lower electrode layer of, e.g., Ta film, the antiferromagnetic layer of, e.g., PtMn, the pinned magnetization layer of, e.g., CoFe, the tunnel insulating film of, e.g., alumina, the free magnetization layer of, e.g., CoFe and the cap layer of, e.g., Ta film are formed by, e.g., sputtering method.

Next, by photolithography and dry etching, the cap layer, the free magnetization layer, the tunnel insulating film, the pinned magnetization layer, the antiferromagnetic layer and the lower electrode layer are patterned to form the MTJ elements 52, connected to the write word lines 38 (see FIG. 3).

Figure 19C:
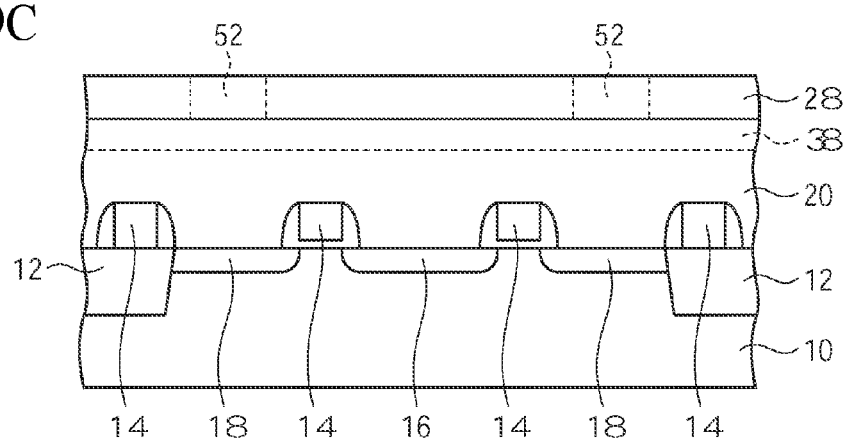
Figure 20C:
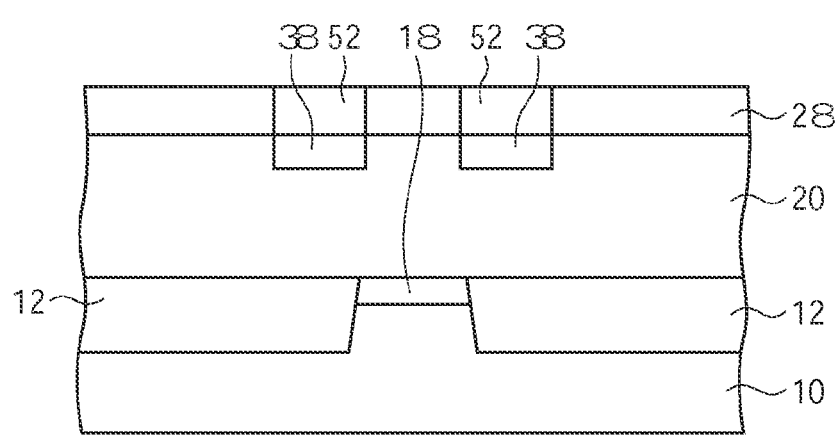

Next, over the inter-layer insulating film 28 with the MTJ elements formed on, a silicon oxide film is deposited by, e.g., CVD method, and the silicon oxide film is planarized by CMP method until the MTJ elements 52 are exposed to thereby form the inter-layer insulating film 28 of the silicon oxide film having the surface planarized (FIG. 19C and FIG. 20C).

Next, by photolithography and dry etching, the contact holes 56 down to the source/drain regions 18 are formed in the inter-layer insulating films 28, 20.

Figure 19D:
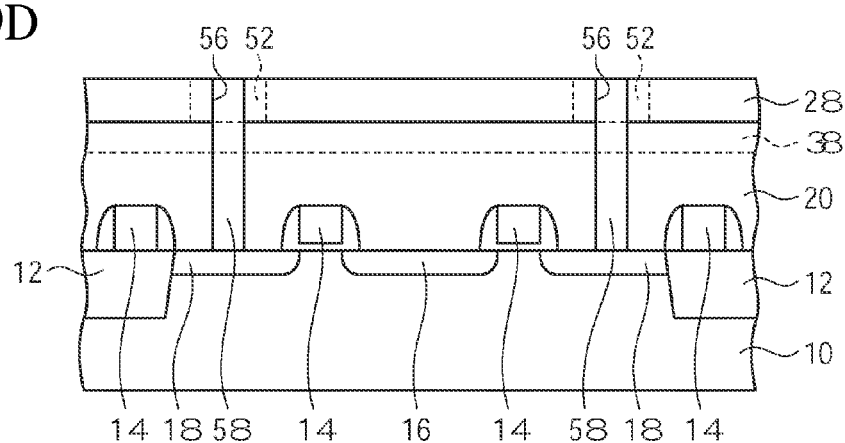
Figure 20D:
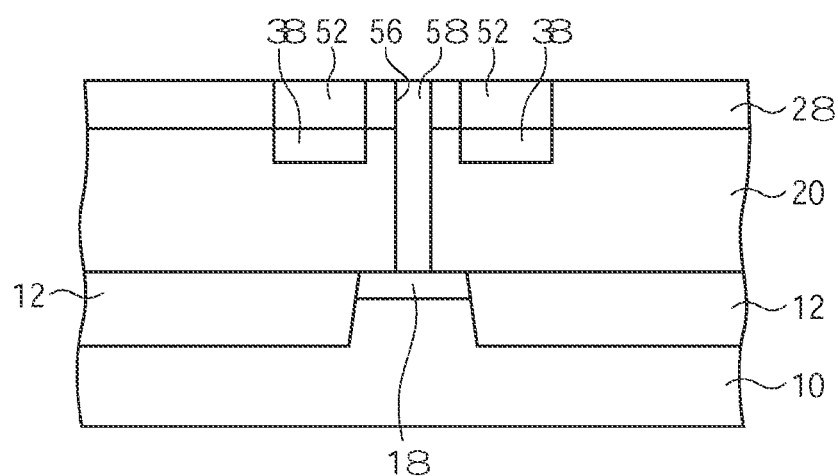

Next, by, e.g., CVD method, a titanium nitride film as a barrier metal and a tungsten film are deposited, and these conductive films are etched or polished back to form the contact plugs 58 buried in the contact holes 56 and electrically connected to the source/drain regions 18 (FIG. 19D and FIG. 20D).

Figure 19E:
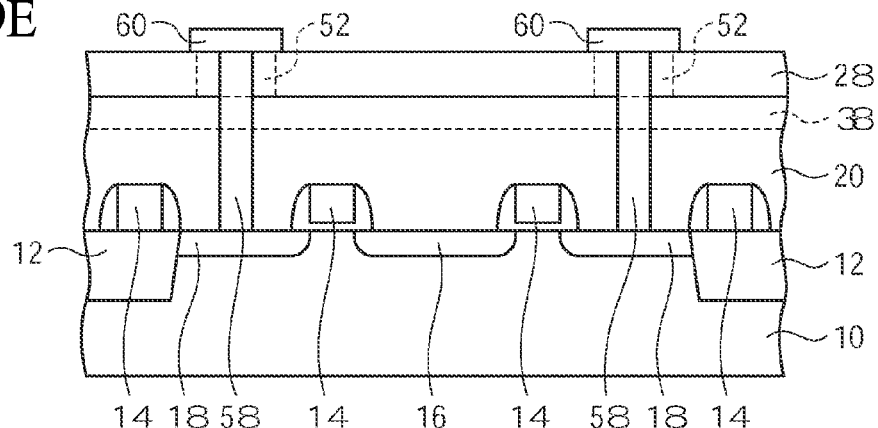
Figure 20E:
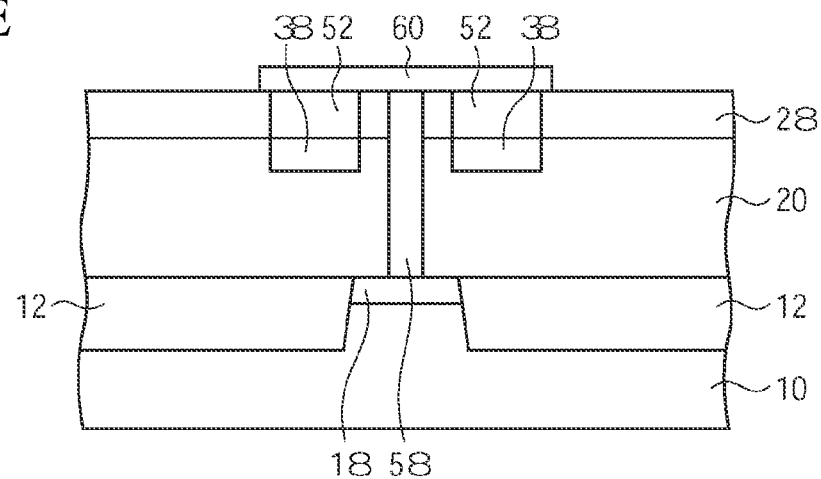

Then, over the inter-layer insulating film 28 with the MTJ elements 52 and the contact plugs 58 buried in, a Ta film is deposited by, e.g., sputtering method and patterned. Thus, the upper electrode layer 60 formed of the Ta film, electrically connected to the source/drain regions via the contact plugs 58 and parallelly connecting the two MTJ elements adjacent to each other with the contact plug 58 therebetween are formed (FIG. 19E and FIG. 20E).

Then, over the inter-layer insulating film 28 with the upper electrode layer 60 formed on, a silicon oxide film is deposited by, e.g., CVD method, and the surface of the silicon oxide film is planarized by CMP method to form the inter-layer insulating film 54 of the silicon oxide film.

Figure 19F:
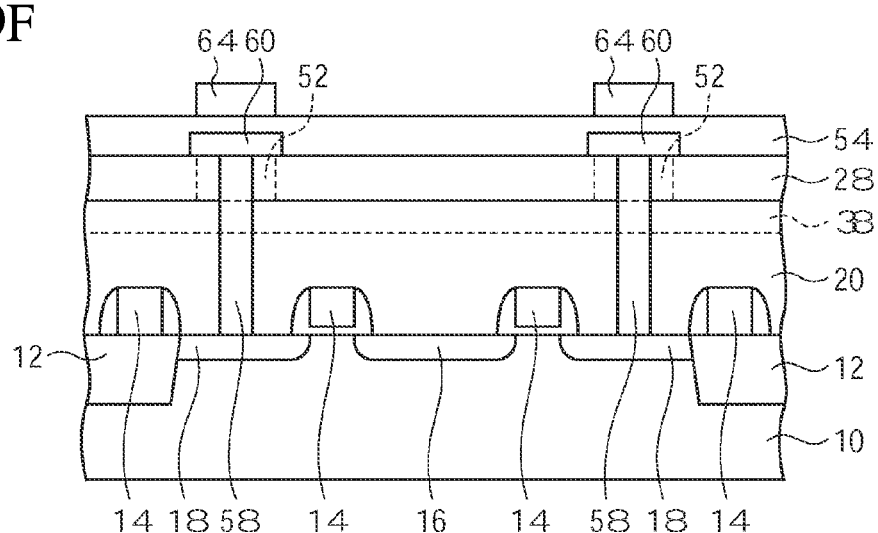
Figure 20F:
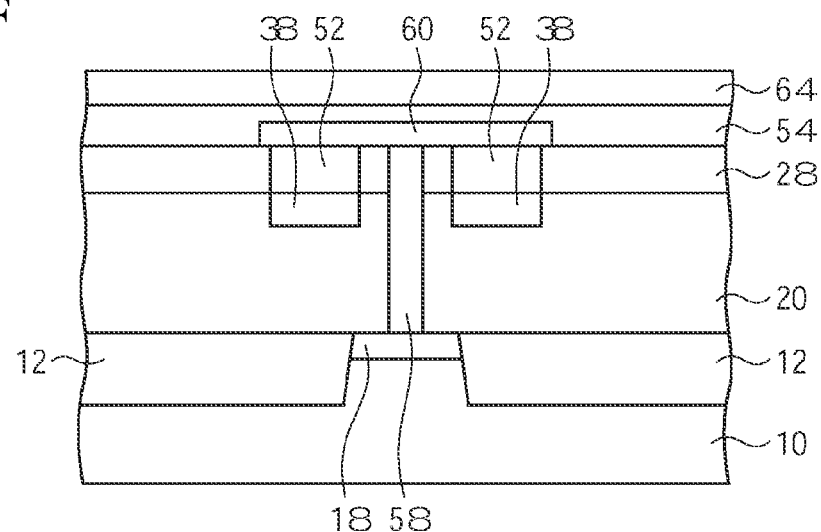

Next, a conductive film is deposited on the inter-layer insulating film 54 and is patterned to form the digit lines 64 (DL) (FIG. 19F, FIG. 20F). As shown in FIG. 15, each digit line 64 is formed in the region between the word lines WL, extended in parallel with the word lines WL.

Next, over the inter-layer insulating film 54 with the digit lines 64 formed on, a silicon oxide film is deposited by, e.g., CVD method, and then the surface of the silicon oxide film is planarized by CMP method to form the inter-layer insulating film 62 of the silicon oxide film.

Next, by photolithography and dry etching, the contact holes 22 down to the source/drain regions 16 are formed in the inter-layer insulating films 62, 54, 28, 20.

Then, by, e.g., CVD method, a titanium nitride film as a barrier metal and a tungsten film are deposited, and then these conductive films are etched back or polished back to form the contact plugs 24, buried in the contact holes 22 and electrically connected to the source/drain regions 16.

Figure 19G:
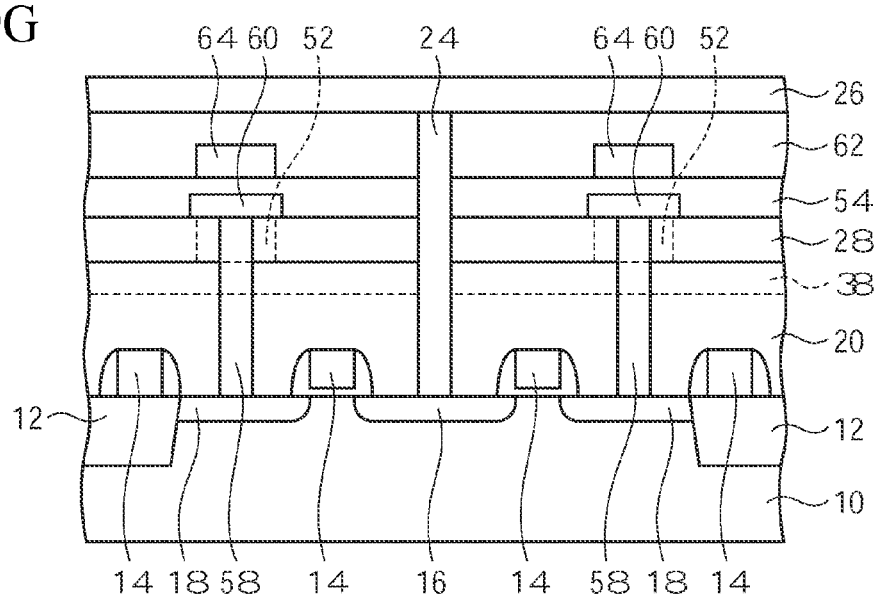
Figure 20G:
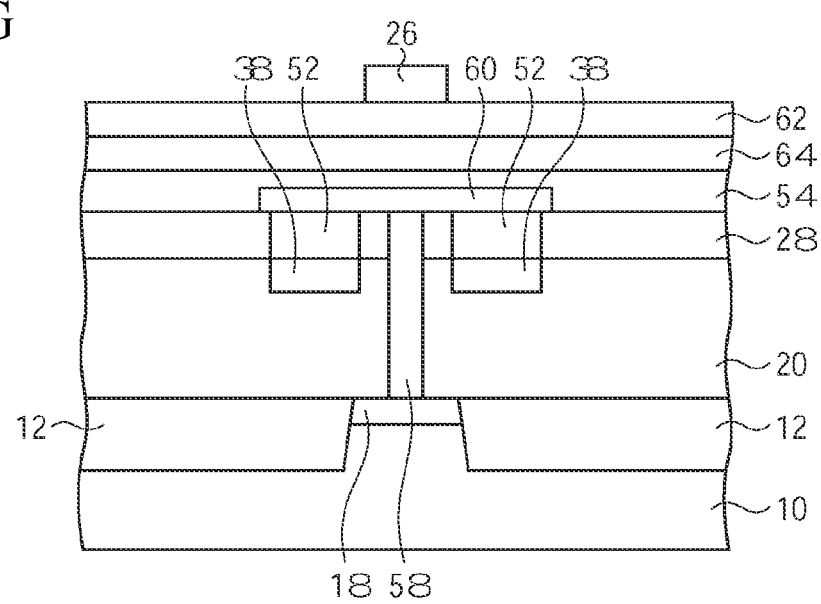

Next, over the inter-layer insulating film 62 with the contact plugs 24 buried in, a conductive film is deposited and is patterned to form the bit lines 26, electrically connected to the source/drain regions 16 via the contact plugs 24 (FIG. 19G and FIG. 20G). As shown in FIG. 15, the bit lines (BL) are formed, extended, crossing the word lines WL.

Hereafter, upper-level interconnection layers, etc. as required are formed, and the magnetic memory device according to the present embodiment is completed.

As described above, according to the present embodiment, the memory cell includes two magnetoresistance effect elements serially connected to each other, and a select transistor connected to the connection node of these magnetoresistance effect elements, and the information memorized in the magnetoresistance effect elements is read based on a voltage of the connection node of the first magnetoresistance effect element and the second magnetoresistance effect element, which is outputted to the bit line connected to the connection node, which facilitates the integration in comparison with the conventional magnetic memory device using the current sense method.

In writing information in the memory cell, information to be memorized is switched by direction of the write currents flowed in the two write word lines, whereby complementary resistance states can be stably and surely written in the two magnetoresistance effect elements in comparison with the method of switching write currents to be flowed to the digit line.

In the magnetic memory device according to the present embodiment, the word lines and the digit lines are arranged in parallel with each other, and crossing these signal lines, two write word lines and the bit line are arranged in parallel with each other, whereby one row address (digit line) and plural column addresses (write word lines) can be selected to make parallel writing in plural memory cells. This can improve the conformity with the general peripheral circuit, writing programs, etc.

A Third Embodiment

The magnetic memory device and method of writing into the same according to a third embodiment of the present invention will be explained with reference to FIGS. 21 to 24F. The same members of the present embodiment as the magnetic memory device and the method of writing into the same according to the first and the second embodiments shown in FIGS. 1 to 20G are represented by the same reference numbers not to repeat or to simplify their explanation.

In the present embodiment, the structure of another magnetic memory device for realizing the circuit structure shown in FIG. 17 and the method of manufacturing the same will be explained. The methods of writing into and reading the magnetic memory device according to the present embodiment are the same as those of the magnetic memory device according to the second embodiment.

First, the structure of the magnetic memory device according to the present embodiment will be explained with reference to FIGS. 21 to 22B.

In a silicon substrate 10, a device isolation film 12 for defining on the surface thereof a plurality of active regions is formed. As shown in FIG. 21, each active region has an elongate shape bent in a V-shape. The plural active regions are arranged zigzag to each other.

Over the silicon substrate 10 with the device isolation film 12 formed in, a plurality of word lines WL extended in the Y-direction are formed. The word lines WL are extended two in each active region. In the active regions on both sides of the word lines, source/drain regions 16, 18 are formed. Thus, in each active region, two select transistors each including the gate electrode 14 also functioning the word line WL and the source/drain regions 16, 18 are formed. The two select transistors formed in one active region have the source/drain region 16 in common.

Over the silicon substrate 10 with the select transistors formed on, an inter-layer insulating film 20 is formed. In the inter-layer insulating film, contact plugs 24 connected to source/drain regions 16 formed in the contact parts of the active regions are buried. Over the inter-layer insulating film 20, a plurality of bit lines 26 (BL) extended in the X-direction and electrically connected to the source/drain regions 16 via the contact plugs 24 are formed. The bit lines 26 are formed, traversing the lower ends of the V-shaped active regions and are connected to the source/drain regions 16 at these parts.

Over the inter-layer insulating film 20 with the bit lines 26 formed on, an inter-layer insulating film 28 is formed. In the inter-layer insulating film 28, a plurality of write word lines 38 (WWL) extended in the X-direction are buried.

Over the inter-layer insulating film 28 with the write word lines 38 buried in, MTJ elements 52 are formed.

Over the inter-layer insulating film 28 except that in the regions where the MTJ elements 52 are formed, an inter-layer insulating film 54 is formed. In the inter-layer insulating films 54, 28, 20, contact plugs 58 connected to the source/drain regions 18 are buried. Over the inter-layer insulating film 54, an upper electrode layer 60 electrically connecting the two MTJ elements 52 adjacent to each other in the Y-direction with the contact plug 58 therebetween, and the contact plug 58 is formed.

Over the inter-layer insulating film 54 with the upper electrode layer 60 formed on, an inter-layer insulating film 62 is formed. Over the inter-layer insulating film 62, a plurality of digit lines (DL) 64 extended in the Y-direction are formed. The digit lines 64 are formed, traversing the MTJ elements 52 arranged in the Y-direction thereabove. The extending direction (Y-direction) of the digit lines (DL) 64 is parallel with the easy magnetization inversion axis (the major axis) of the MTJ elements 52.

Figure 15:
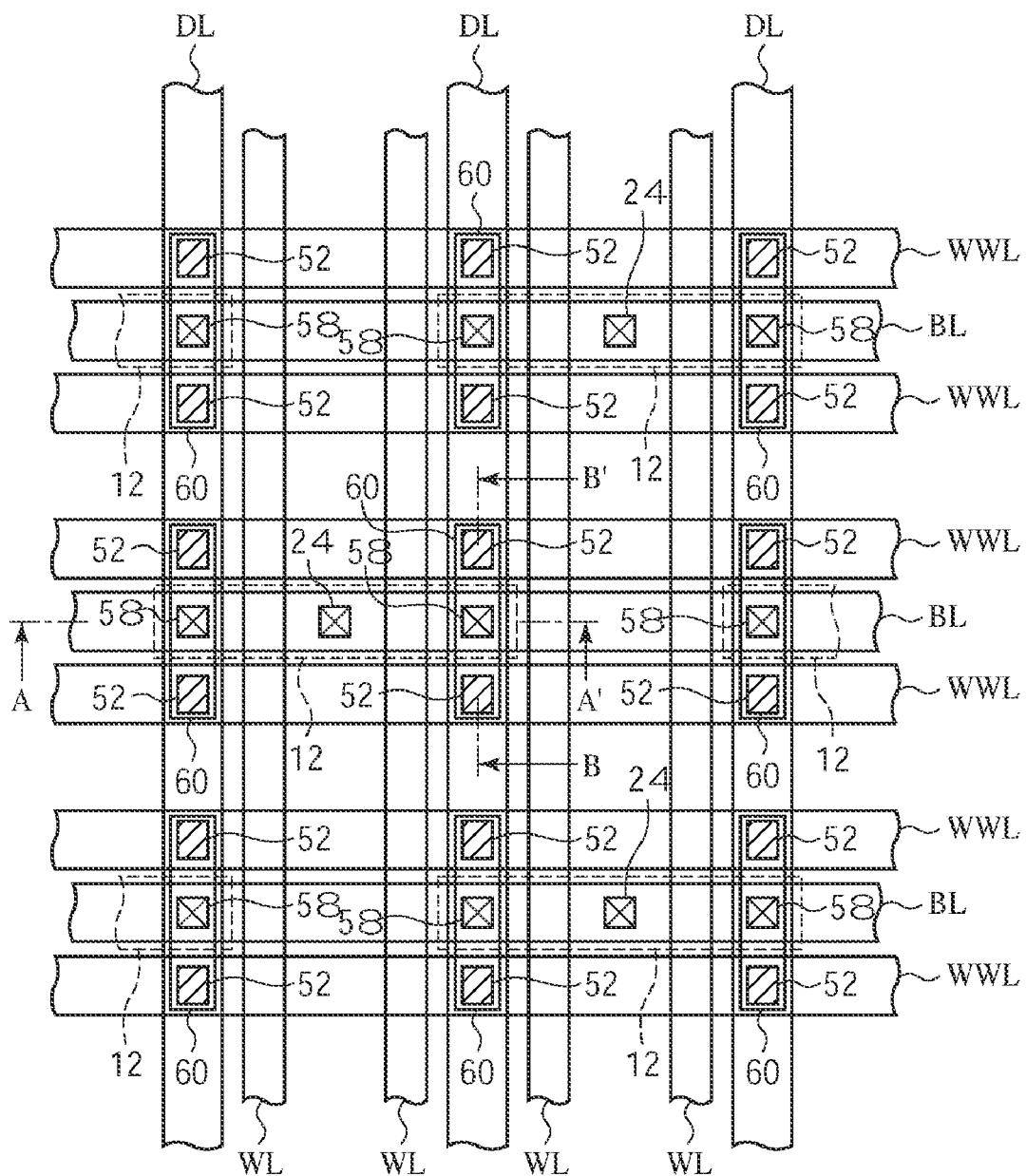
FIG. 15 is a plan view showing the structure of the magnetic memory device according to a second embodiment of the present invention.
Figure 16A:
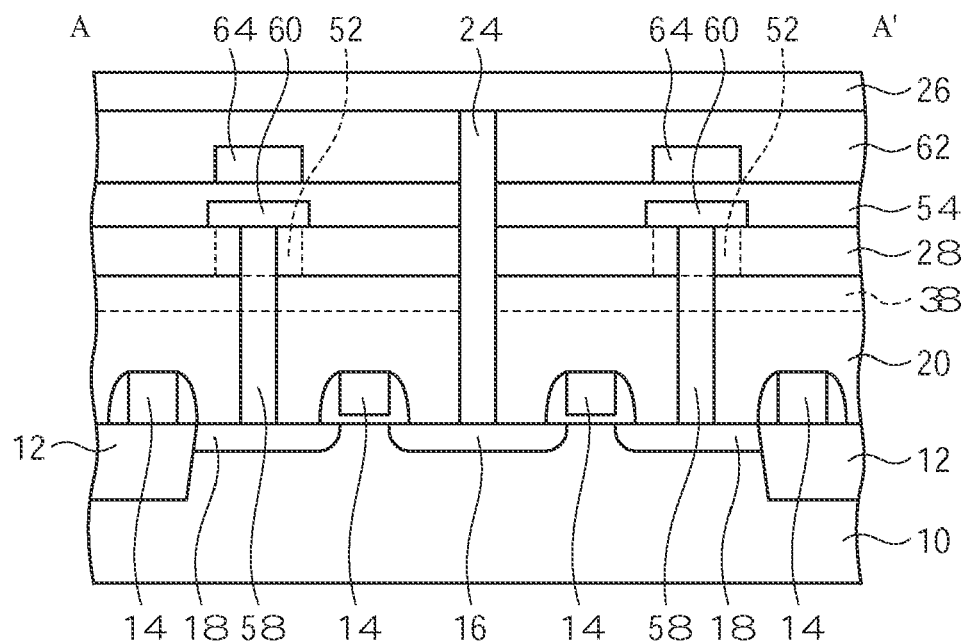
FIGS. 16A and 16B are diagrammatic sectional views showing the structure of the magnetic memory device according the second embodiment of the present invention.
Figure 16B:
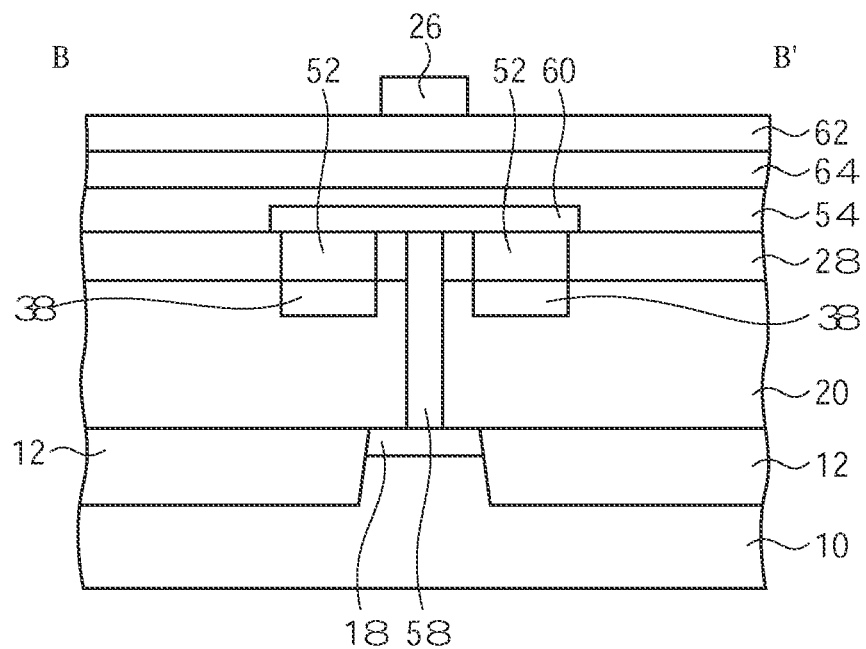

As described above, the magnetic memory device according to the present embodiment is characterized mainly in that in the magnetic memory device according to the second embodiment shown in FIG. 15, the positions of the bit line contacts (contact plugs 24) are offset in the Y-direction so that the contact plugs 24 and the contact plugs 58 are not arranged side by side in the X-direction. To realize such layout, in the magnetic memory device according to the present embodiment, the device regions have the V-shape.

Such structure of the magnetic memory device allows the bit lines 26, the upper electrode layer 60 and the contact plugs 58 not to overlap one another in plane and allows the bit lines 26 to be formed lower of the upper electrode layer 60. In comparison with the magnetic memory device according to the second embodiment, the bit line contact holes (contact plugs 24) can be shallow, which facilitates the manufacture and can decrease the contact resistance.

Figure 21:
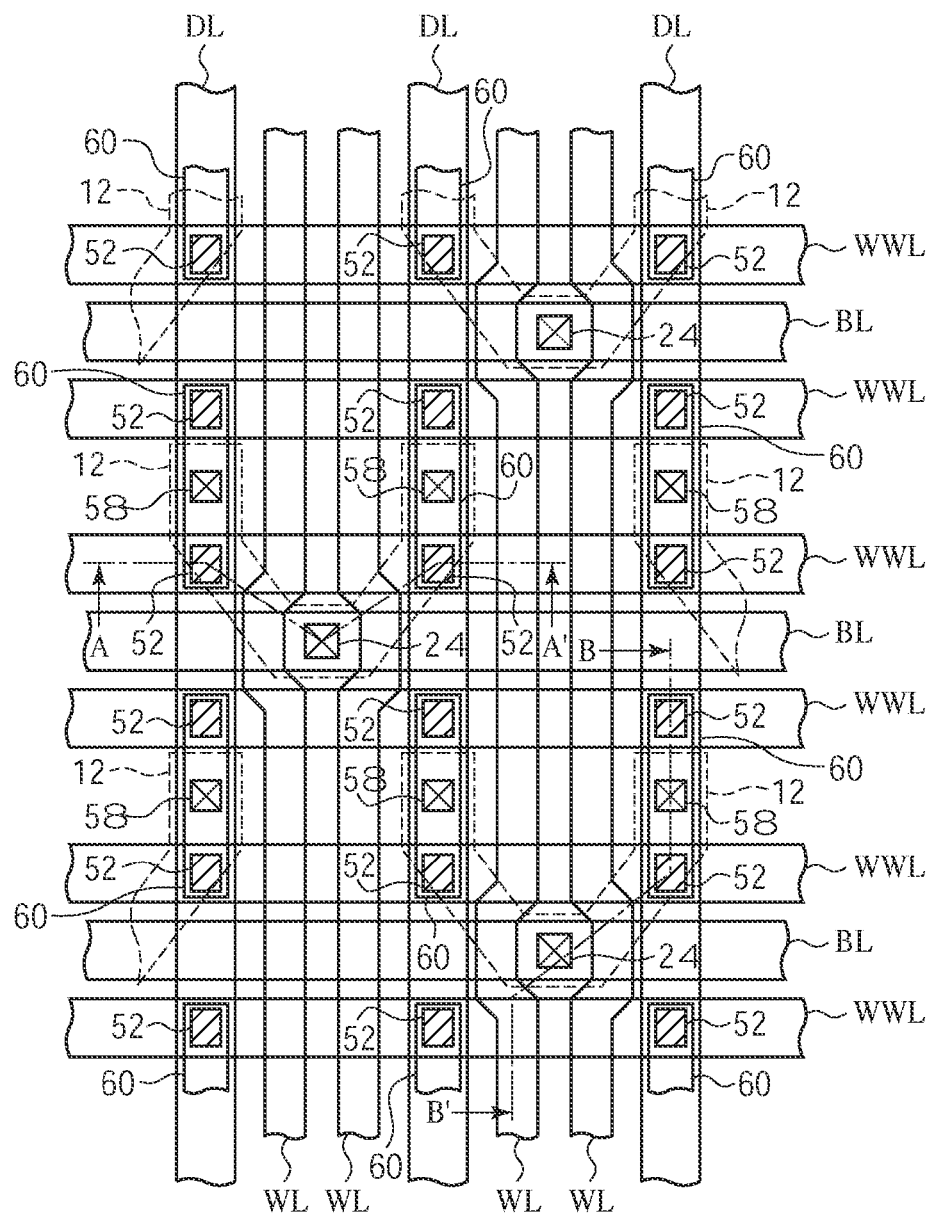
FIG. 21 is a plan view showing the structure of the magnetic memory device according to a third embodiment of the present invention.
Figure 22A:
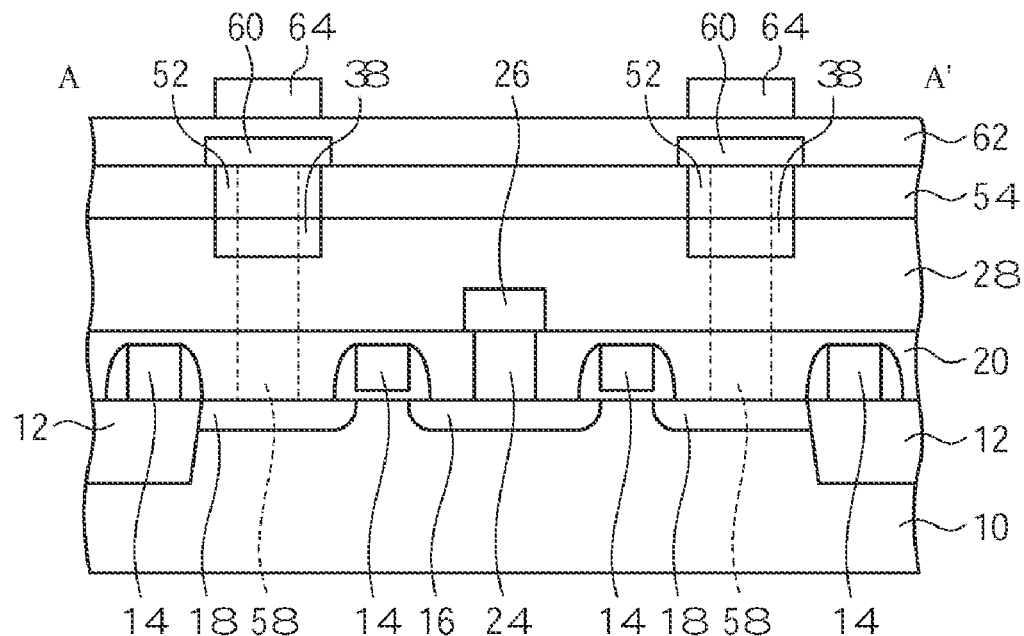
FIGS. 22A and 22B are diagrammatic sectional views showing the structure of the magnetic memory device according to the third embodiment of the present invention.
Figure 22B:
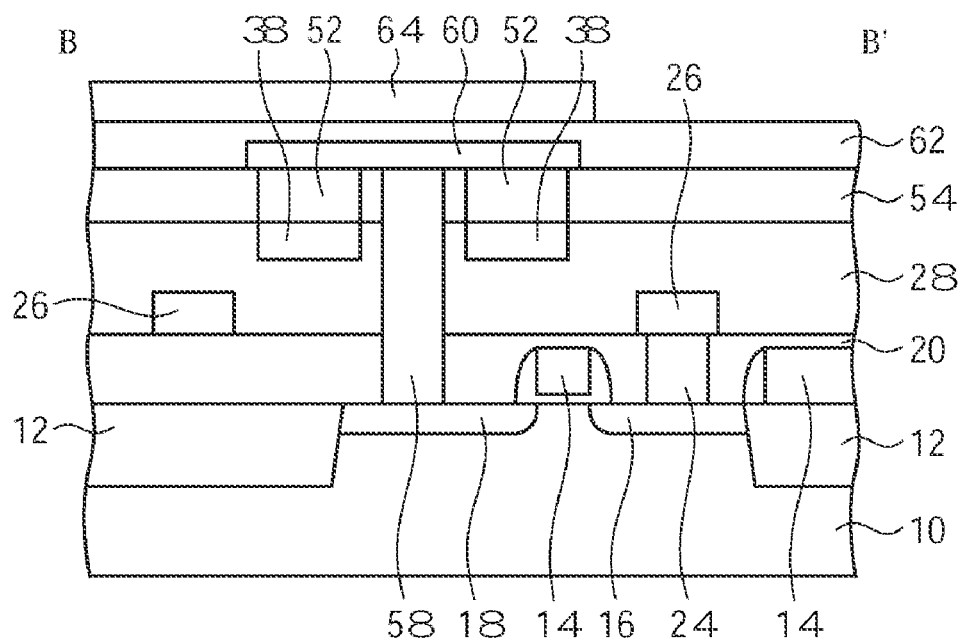

The interval between the contact plugs 24 and the contact plugs 58 is larger, which allows the word lines WL to be bent near the bit line contacts (contact plugs 24), circumventing the bit line contacts (see FIG. 21). According to this, the pitches of the word lines WL and the digit lines DL can be narrow, whereby the magnetic memory device can be highly integrated in comparison with the second embodiment. Specifically, the digit lines can be formed in a 3F pitch, and the area of the unit memory cell can be decreased to $3F \times 12F = 12F^2$.

Figure 23A:
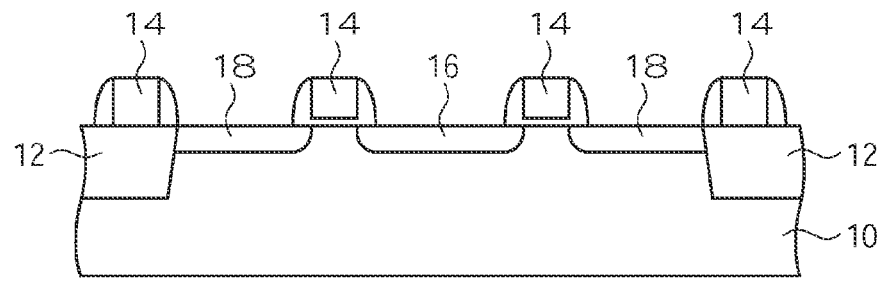
FIGS. 23A-23F, 24A-24F are sectional views showing the method of manufacturing the magnetic memory device according to the third embodiment of the present invention.

Next, the method of manufacturing the magnetic memory device according to the present embodiment will be explained with reference to FIGS. 23A to 24F. FIGS. 23A-19F are the sectional view along the line A-A' in FIG. 21, and FIGS. 24A-24F are the sectional view along the line B-B' in FIG. 21. FIGS. 23A-23F correspond to FIGS. 24A-24F, respectively.

First, in the silicon substrate 10, the device isolation film 12 is formed by, e.g., STI method. At this time, the active regions defined by the device isolation film 12 are V-shaped bent in the Y-direction (see FIG. 21).

Figure 24A:
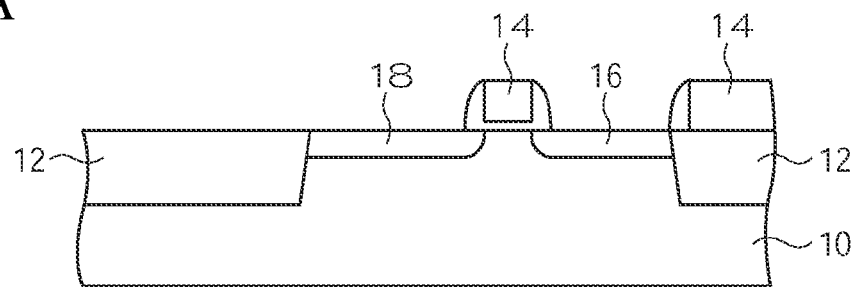

Next, in the active regions defined by the device isolation film 12, the select transistors each including the gate electrode 14 and the source/drain regions 16, 18 are formed in the same way as in the method of manufacturing the usual MOS transistors (FIG. 23A and FIG. 24A). The select transistors are formed two in each active region. The gate electrodes 14 are formed, extended vertically as viewed in the drawing and, as shown in FIG. 21, form the read word lines WL functioning also as the gate electrodes 14 of the plural select transistors.

Next, over the silicon substrate 10 with the select transistors formed on, a silicon oxide film is deposited by, e.g., CVD method, and then the surface of the silicon oxide film is planarized by CMP method to form the inter-layer insulating film 20 of the silicon oxide film.

Then, by photography and dry etching, the contact holes 22 down to the source/drain regions 16 are formed in the inter-layer insulating film 20.

Next, by, e.g., CVD method, a titanium nitride film as a barrier metal, and a tungsten film are deposited, and then these conductive films are etched back or polished back to form the contact plugs 24 buried in the contact holes 22 and electrically connected to the source/drain regions 16.

Figure 23B:
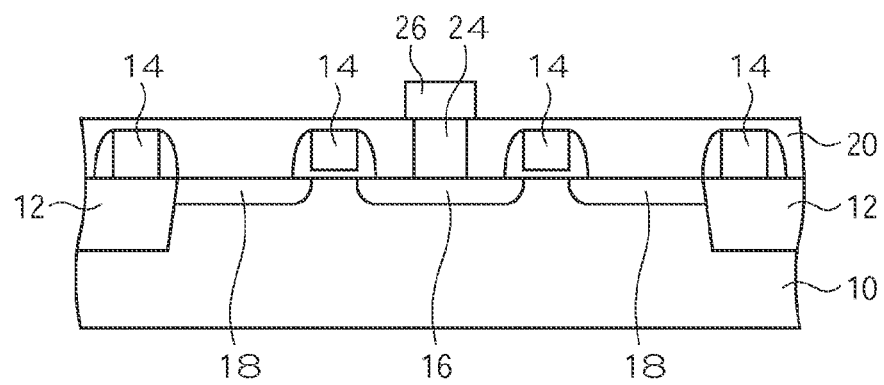
Figure 24B:
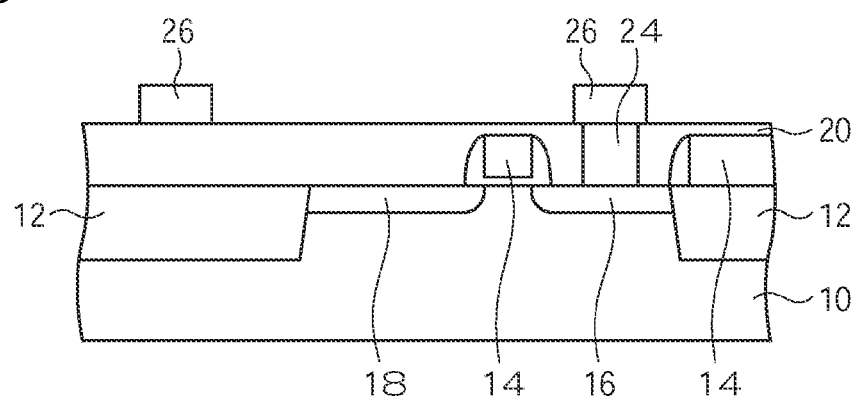

Then, over the inter-layer insulating film 20 with the contact plugs 24 buried in, a conductive film is deposited and patterned to form the bit lines 26 electrically connected to the source/drain regions 16 via the contact plugs 24 (FIG. 23B and FIG. 24B). As shown in FIG. 21, the bit lines 26 (BL) are formed, extended, crossing the word lines WL.

Next, over the inter-layer insulating film 20 with the bit lines 26 formed on, a silicon oxide film is deposited by, e.g., CVD method, and then the surface of the silicon oxide film is planarized by CMP method to form the inter-layer insulating film 28 of the silicon oxide film.

Next, by photolithography and etching, the interconnection trenches 30 for burying the write word lines in are formed in the inter-layer insulating film 28.

Figure 23C:
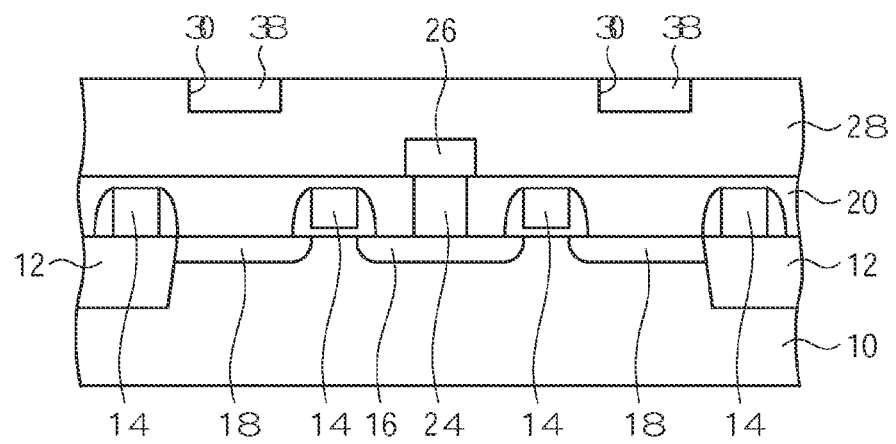
Figure 24C:
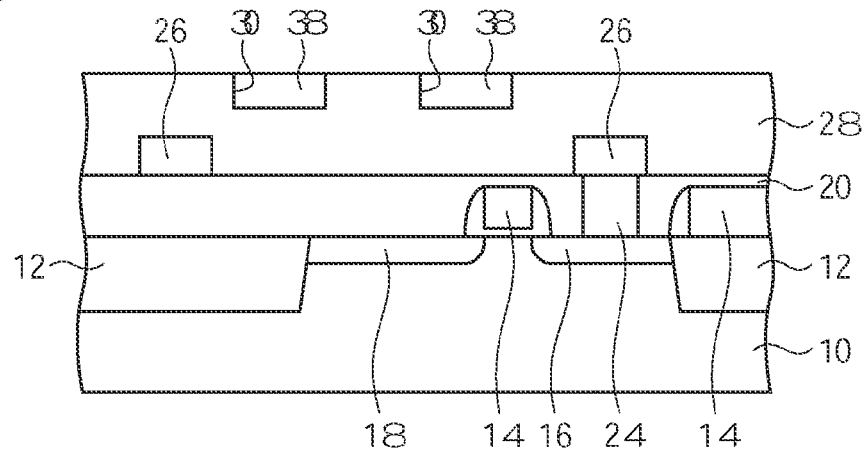

Next, a Ta film and an NiFe film are deposited by, e.g., sputtering method, a Cu film is deposited by, e.g., electroplating method, and then these conductive films are planarized by CMP method to form the write word lines 38, buried in the interconnection trenches 30 (FIG. 23C, FIG. 24C and FIG. 3). As shown in FIG. 21, the write word lines 38 (WWL) are formed, extended vertically to the extending direction of the word lines WL.

Then, over the inter-layer insulating film 28 with the write word lines 38 buried in, the lower electrode layer of, e.g., Ta film, the antiferromagnetic layer of, e.g., PtMn, the pinned magnetization layer of, e.g., CoFe, the tunnel insulating film of, e.g., alumina, the free magnetization layer of, e.g. CoFe and the cap layer of, e.g., Ta film are formed by, e.g., sputtering method.

Figure 23D:
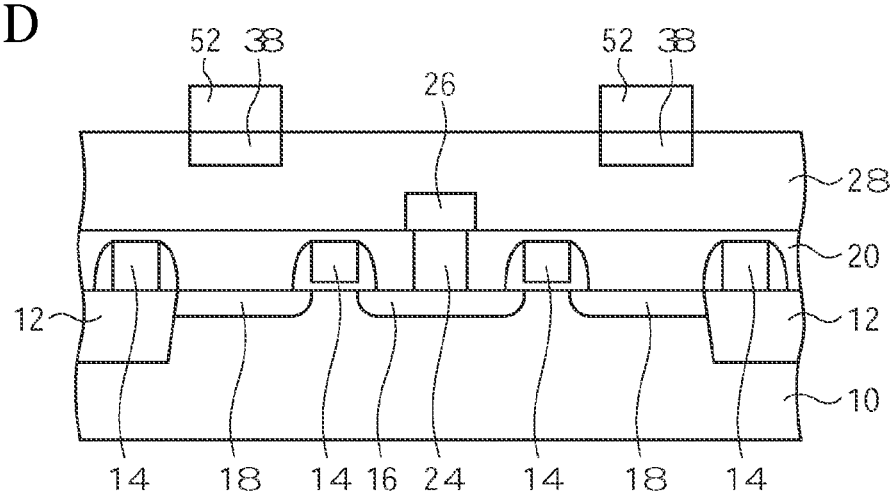
Figure 24D:
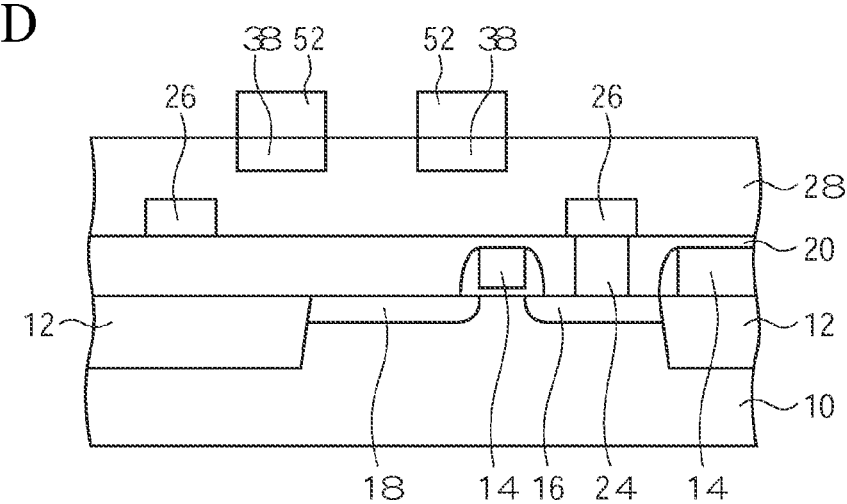

Next, by photolithography and dry etching, the cap layer, the free magnetization layer, the tunnel insulating film, the pinned magnetization layer, the antiferromagnetic layer and the lower electrode layer are patterned to form the MTJ elements 52 connected to the write word lines 38 (FIG. 23D, FIG. 24D and FIG. 3).

Next, over the inter-layer insulating film 28 with the MTJ elements formed on, a silicon oxide film is deposited by, e.g., CVD method and then is planarized by CMP method until the MTJ elements 52 are exposed to thereby form the inter-layer insulating film 54 of the silicon oxide film having the surface planarized.

Next, by photolithography and dry etching, the contact holes 56 down to the source/drain regions 18 are formed in the inter-layer insulating films 54, 28, 20.

Next, a titanium nitride film as a barrier metal, and a tungsten film are deposited by, e.g., CVD method, and these conductive films are etched back or polished back to form the contact plugs 58 buried in the contact holes 46 and electrically connected to the source/drain regions 18.

Figure 23E:
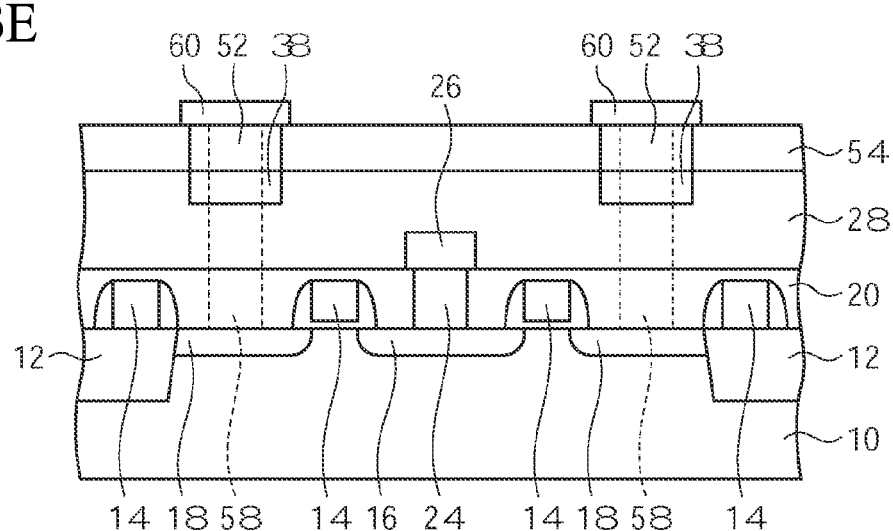
Figure 24E:
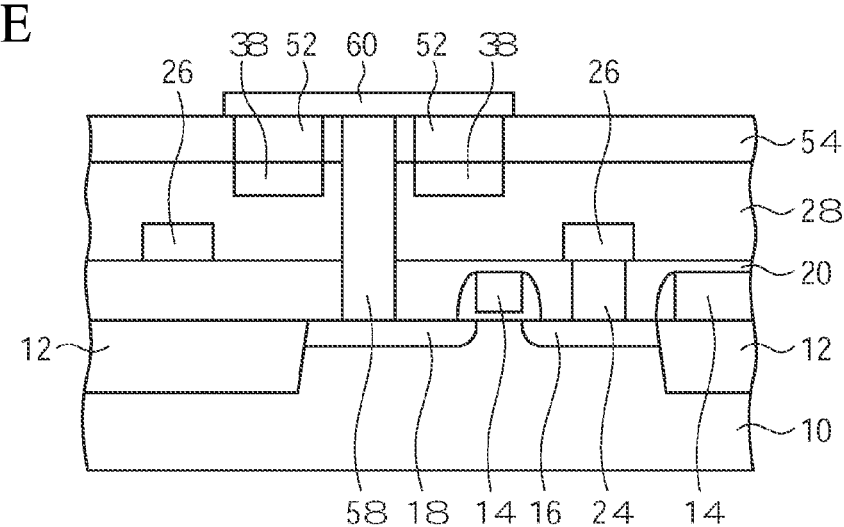

Then, over the inter-layer insulating film with the MTJ elements 52 and the contact plugs 58 buried in, a Ta film is deposited by, e.g., sputtering method and patterned to form the upper electrode layer 60 electrically connected to the source/drain regions 18 via the contact plugs 58 and parallelly connecting two MTJ elements 52 adjacent to each other with the contact plug 58 therebetween (FIG. 23E and FIG. 24E).

Next, over the inter-layer insulating film 54 with the upper electrode layer 60 formed on, a silicon oxide film is deposited by, e.g., CVD method, and the surface is planarized by CMP method to form the inter-layer insulating film 62 of the silicon oxide film.

Figure 23F:
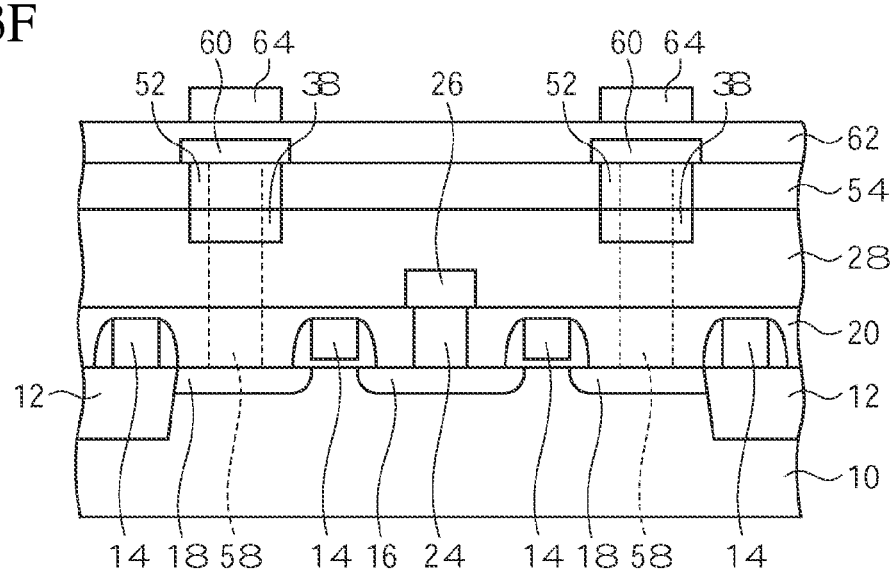
Figure 24F:
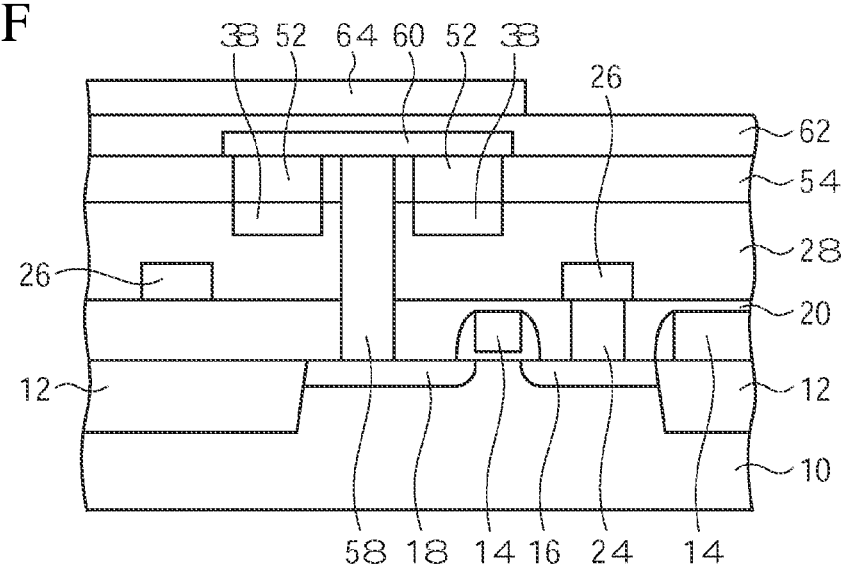

Next, a conductive film is deposited on the inter-layer insulating film 62 and is patterned to form the digit lines (DL) 64 (FIG. 23F and FIG. 24F). As shown in FIG. 21, the digits lines DL are formed, in the regions between the word lines WL, extended in parallel with the word lines WL.

Then, upper-level interconnection layers, etc. as required are formed, and the magnetic memory device according to the present embodiment is completed.

As described above, according to the present embodiment, in the magnetic memory device according to the second embodiment described above, the active regions are formed in the V-shape, and the bit line contacts are arranged, offset, whereby the present embodiment can make the bit line contact holes shallower in comparison with the magnetic memory device according to the second embodiment, which facilitates the manufacture. The contact resistance of the bit line contacts can be decreased. This also allows the pitch of the digit lines to be reduced, and the magnetic memory device according to the present embodiment can be more integrated than the magnetic memory device according to the second embodiment.

Modified Embodiments

The present invention is not limited to the above-described embodiments and can cover other various modifications.

For example, in the above-described embodiments, the present invention is applied to the magnetic memory device using MTJ elements. However, the present invention is applicable widely to magnetic memory devices using 1T-2MTJ-type using the magnetoresistance effect elements, which make use of resistance changes based on relationships of spins of the magnetic layers. For example, the present invention is applicable to magnetic memory devices using magnetoresistance effect elements including two magnetic layers stacked with a conductive nonmagnetic layer therebetween.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of writing into a magnetic memory device comprising:

flowing a first write current to a first signal line;

flowing a second write current to a second signal line, the second write current being directed opposite to the first write current;

flowing a third write current to a third signal line; and memorizing a first memory information or a second memory information, based on directions of the first write current and the second write current, wherein the magnetic memory device including a memory cell including a first magnetoresistance effect element, a second magnetoresistance effect element having one terminal connected to one terminal of the first magnetoresistance effect element, and a select transistor connected to a connection node of the first magnetoresistance effect element and the second magnetoresistance effect element; the first signal line extended in a first direction and connected to the other end of the first magnetoresistance effect element; the second signal line extended in the first direction and connected to the other end of the second magnetoresistance effect element; and the third signal line extended in a second direction crossing the first direction, crossing the first signal line in a region where the first magnetoresistance effect element is formed, and crossing the second signal line in the region where the second magnetoresistance effect element is formed, wherein the magnetic memory device memorizes the first memory information with the first magnetoresistance effect element being in a high resistance state and the second magnetoresistance effect element being in a lower resistance state or the second memory information with the first magnetoresistance effect element being in the lower resistance state and the second magnetoresistance effect element being in the high resistance state.

2. A method of writing into a magnetic memory device comprising:

when a first memory information is written into a memory cell, a first write current is flowed to a first signal line, a second write current being directed opposite to the first write current is flowed to a second signal line, and a third write current is flowed to a third signal line to apply to a first magnetoresistance effect element a synthetic magnetic field of a magnetic field generated by the first write current and a magnetic field generated by the third write current and apply to a second magnetoresistance effect element a synthetic magnetic field of a magnetic field generated by the second write current and a magnetic field generated by the third write current, and when a second memory information is written in the memory cell, a fourth write current which is directed opposite to the first write current is flowed to the first signal line, a fifth write current of the same direction as the first write current is flowed to the second signal line, a sixth write current of the same direction as the third write current is flowed to the third signal line to apply the first magnetoresistance effect element a synthetic magnetic field of a magnetic field generated by the fourth write current and a magnetic field generated by the sixth write current and apply to the second magnetoresistance effect element a synthetic magnetic field of a magnetic field generated by the fifth write current and a magnetic field generated by the sixth write current, wherein the magnetic memory device including the memory cell including the first magnetoresistance effect element, the second magnetoresistance effect element having one terminal connected to one terminal of the first magnetoresistance effect element, and a select transistor connected to a connection node of the first magnetoresistance effect element and the second magnetoresistance effect element; the first signal line extended in a first direction and connected to the other end of the first magnetoresistance effect element; the second signal line extended in the first direction and connected to the other end of the second magnetoresistance effect element; and the third signal line extended in a second direction crossing the first direction, crossing the first signal line in a region where the first magnetoresistance effect element is formed, and crossing the second signal line in the region where the second magnetoresistance effect element is formed, wherein the magnetic memory device memorizes the first memory information with the first magnetoresistance effect element being in a high resistance state and the second magnetoresistance effect element being in a lower resistance state or the second memory information with the first magnetoresistance effect element being in the lower resistance state and the second magnetoresistance effect element being in the high resistance state.

3. The method of writing into a magnetic memory device according to claim 2, wherein the magnetic memory device including a plurality of said memory cells, and a plurality of said first signal lines and a plurality of said second signal lines which are respectively connected to said respective plural memory cells, and for said respective plurality of memory cells, directions of said write currents to be flowed to the first signal lines and the second signal lines are set discretely corresponding to information-to-be-memorized to be written to thereby write simultaneously into said respective plurality of memory cells.

4. The method of writing into a magnetic memory device according to claim 3, wherein the magnetic memory device further includes a first current source disposed on a side of one ends of the first signal line and the second signal line, and a second current source disposed on a side of the other ends of the first signal lines and the second signal lines, said first write current or the fifth write current is supplied from the first current source, and the second write current or the fourth write current is supplied from the second current source.

5. The method of writing into a magnetic memory device according to claim 3, wherein the magnetic memory device further includes a current source disposed on a side of one ends of the first signal line and the second signal line, and a switching element disposed on a side of the other ends of the first signal line and the second signal line, for electrically connecting or disconnecting the first signal line and the second signal line, and when a memory information is written, the first signal line and the second signal line are electrically connected to each other by the switching element to form a current path of the first signal line and the second signal line connected to each other and supply the write current from the current source to the current path of the first signal line and the second signal line.

6. The method of writing into a magnetic memory device according to claim 3, wherein the magnetic memory device further includes a current source disposed on a side of one ends of the first signal line and the second signal line, and a switching element disposed on a side of the other ends of the first signal lines and the second signal lines, for electrically connecting or disconnecting the first signal line and the second signal line, and when a memory information is written, the first signal line and the second signal line are electrically connected to each other by the switching element to form a current path of the first signal line and the second signal line connected to each other and supply the write current from the current source to the current path to the first signal line and the second signal line.

7. The method of writing into a magnetic memory device according to claim 2, wherein the magnetic memory device further includes a first current source disposed on a side of one ends of the first signal line and the second signal line, and a second current source disposed on a side of the other ends of the first signal lines and the second signal lines, said first write current or the fifth write current is supplied from the first current source, and the second write current or the fourth write current is supplied from the second current source.

8. The method of writing into a magnetic memory device according to claim 2, wherein the magnetic memory device further includes a current source disposed on a side of one ends of the first signal line and the second signal line, and a switching element disposed on a side of the other ends of the first signal line and the second signal line, for electrically connecting or disconnecting the first signal line and the second signal line, and when a memory information is written, the first signal line and the second signal line are electrically connected to each other by the switching element to form a current path of the first signal line and the second signal line connected to each other and supply the write current from the current source to the current path of the first signal line and the second signal line.

9. A magnetic memory device comprising:

a memory cell including a first magnetoresistance effect element, a second magnetoresistance effect element having one terminal connected to one terminal of the first magnetoresistance effect element, and a select transistor connected to a connection node of the first magnetoresistance effect element and the second magnetoresistance effect element;

a first signal line extended in a first direction and connected to the other end of the first magnetoresistance effect element;

a second signal line extended in the first direction and connected to the other end of the second magnetoresistance effect element;

a third signal line extended in a second direction crossing the first direction, crossing the first signal line in a region where the first magnetoresistance effect element is formed, and crossing the second signal line in the region where the second magnetoresistance effect element is formed, a fourth signal line extended in the first direction and connected to the connection node of the memory cell via the select transistor; and another memory cell formed adjacent to said memory cell in the first direction, wherein the select transistors of said memory cell and said another memory cell are formed in one active region, and a contact connecting the select transistors of said memory cell and said another memory cells to the fourth signal line are in common.

10. The magnetic memory device according to claim 9, wherein the active region has a rectangular shape elongated in the first direction.

11. The magnetic memory device according to claim 9, wherein the active region has a V-shape bent in the second direction.

12. The magnetic memory device according to claim 9, further comprising:

a drive circuit for writing memory information into the memory cell, wherein when a first memory information is written into the memory cell, the drive circuit flows a first write current to the first signal line, a second write current directed opposite to the first write current to the second signal line, and a third write current to a third signal line to apply to a first magnetoresistance effect element a synthetic magnetic field of a magnetic field generated by the first write current and a magnetic field generated by the third write current and apply to a second magnetoresistance effect element a synthetic magnetic field of a magnetic field generated by the second write current and a magnetic field generated by the third write current, and when a second memory information is written in the memory cell, the drive circuit flows a fourth write current directed opposite to the first write current to the first signal line, a fifth write current of the same direction as the first write current to the second signal line, a sixth write current of the same direction as the third write current to the third signal line to apply the first magnetoresistance effect element a synthetic magnetic field of a magnetic field generated by the fourth write current and a magnetic field generated by the sixth write current and apply to the second magnetoresistance effect element a synthetic magnetic field of a magnetic field generated by the fifth write current and a magnetic field generated by the sixth write current.

13. The magnetic memory device according to claim 9, which includes: a plurality of said memory cells, and a plurality of said first signal lines and a plurality of said second signal lines which are respectively connected to said respective plural memory cells, and which further comprises: a drive circuit for writing memory information into the plurality of said memory cells, wherein for said respective plurality of memory cells, the drive circuit sets directions of said write currents to be flowed to the first signal lines and the second signal lines discretely corresponding to information-to-be-memorized to be written and flows said write currents to thereby write simultaneously into said respective plurality of memory cells.

14. The magnetic memory device according to claim 9, which includes: a plurality of said memory cells, and a plurality of said first signal lines and a plurality of said second signal lines which are respectively connected to said respective plural memory cells, and which further comprises:

a first current source disposed on a side of one ends of the first signal line and the second signal line;

a second current source disposed on a side of the other ends of the first signal lines and the second signal lines; and a drive circuit for driving the first current source and the second current source for writing information into the plurality of said memory cells, wherein the drive circuit drives the first current source and the second current source so as to supply said first write current or the fifth write current from the first current source to, and to supply said second write current or the fourth write current from the second current source.

15. The magnetic memory device according to claim 9, further comprising:

a current source disposed on a side of one ends of the first signal line and the second signal line;

a switching element disposed on a side of the other ends of the first signal line and the second signal line, for electrically connecting or disconnecting the first signal line and the second signal line; and a drive circuit for driving the current source for writing information into the memory cell, wherein when a memory information is written, the drive current drives the current source and the switching element so as to electrically connect the first signal line and the second signal line to each other by the switching element to form a current path of the first signal line and the second signal line connected to each other, and to supply the write current from the current source to the current path of the first signal line and the second signal line.

16. The magnetic memory device according to claim 9, which includes: a plurality of said memory cells, and a plurality of said first signal lines and a plurality of said second signal lines which are respectively connected to said respective plural memory cells, and which further comprises:

a current source disposed on a side of one ends of the first signal line and the second signal line;

a switching element disposed on a side of the other ends of the first signal line and the second signal line, for electrically connecting or disconnecting the first signal line and the second signal line; and a drive circuit for driving the current source for writing information into the memory cell, wherein when a memory information is written, the drive current drives the current source and the switching element so as to electrically connect the first signal line and the second signal line to each other by the switching element to form a current path of the first signal line and the second signal line connected to each other, and to supply the write current from the current source to the current path of the first signal line and the second signal line.

* * * * *